United States Patent [19]
Ishigaki

[11] Patent Number: 5,832,027
[45] Date of Patent: Nov. 3, 1998

[54] SPREAD SPECTRUM MODULATING AND DEMODULATING APPARATUS FOR TRANSMISSION AND RECEPTION OF FSK AND PSK SIGNALS

[75] Inventor: Yukinobu Ishigaki, Miura, Japan

[73] Assignee: Victor Company of Japan, Ltd., Yokohama, Japan

[21] Appl. No.: 607,560

[22] Filed: Feb. 27, 1996

Related U.S. Application Data

[62] Division of Ser. No. 340,407, Nov. 15, 1994.

[30] Foreign Application Priority Data

Nov. 19, 1993 [JP] Japan .................................. 5-314278
Nov. 19, 1993 [JP] Japan .................................. 5-314279
Nov. 29, 1993 [JP] Japan .................................. 5-323262

[51] Int. Cl.$^6$ ............................. H04B 1/707; H04B 1/06; H03D 3/00; H04L 27/00
[52] U.S. Cl. ........................ 375/206; 375/216; 375/322; 455/142
[58] Field of Search ..................... 375/206, 216, 375/316, 322, 323; 455/142, 144

[56] References Cited

U.S. PATENT DOCUMENTS

| | | | |
|---|---|---|---|
| 3,828,307 | 8/1974 | Hungerford | 340/909 |
| 4,435,822 | 3/1984 | Spencer et al. | 375/206 |
| 5,101,417 | 3/1992 | Richley et al. | 375/206 |

*Primary Examiner*—Stephen Chin
*Assistant Examiner*—Jeffrey W. Gluck
*Attorney, Agent, or Firm*—Pollock, Vande Sande & Priddy

[57] ABSTRACT

A spread spectrum modulating and demodulating apparatus which is capable of providing FSK or PSK spread spectrum communications. In a transmitting device an input information signal is fed either to an oscillator or to a side of a power supply which is in turn connected to an operation device. An oscillator produces a carrier frequency signal which multiplied by a multiplier by the predetermined integer N1. A frequency divider divides the frequency of the carrier by a predetermined integer N2. A spread code generator uses an output signal of the frequency divider as a clock signal, and generates a spread code which is fed to the operation device. A switch selectively feeds an input information signal to either the oscillator for frequency shift keying the oscillator or through the side of the power supply connected to the operation device will effect a phase shift key operation. A spread spectrum demodulating device additionally provides for demodulation of either a frequency shift keyed signal or a phase shift keyed signal.

17 Claims, 16 Drawing Sheets

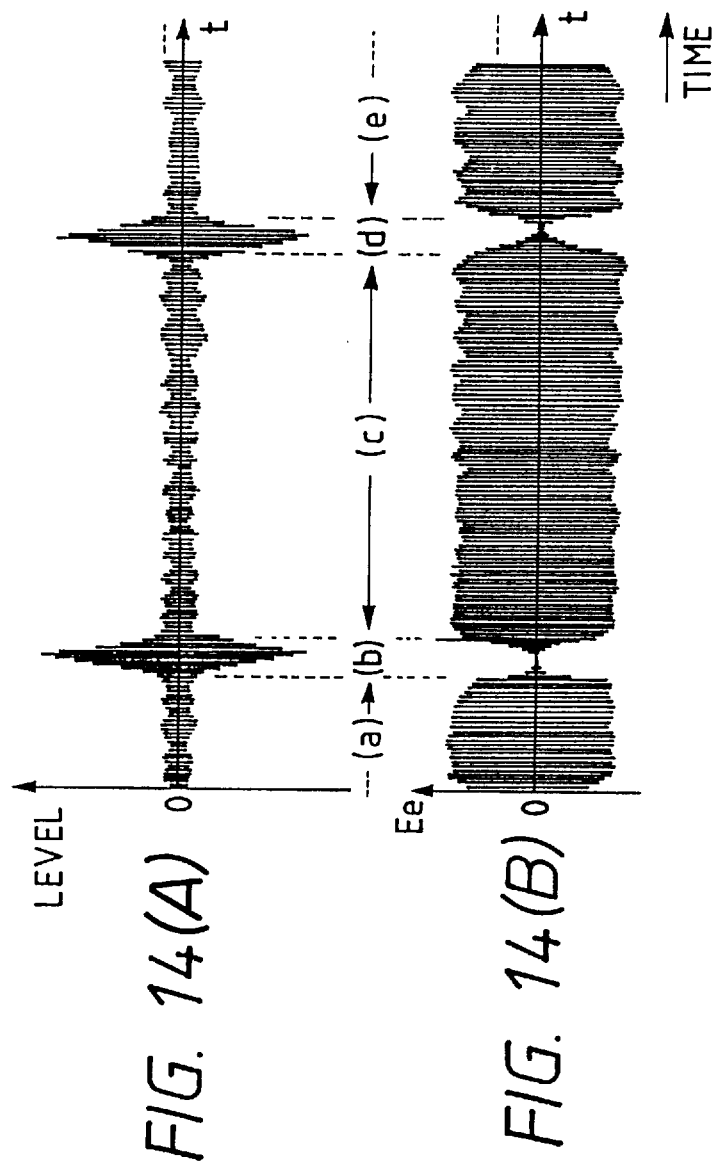

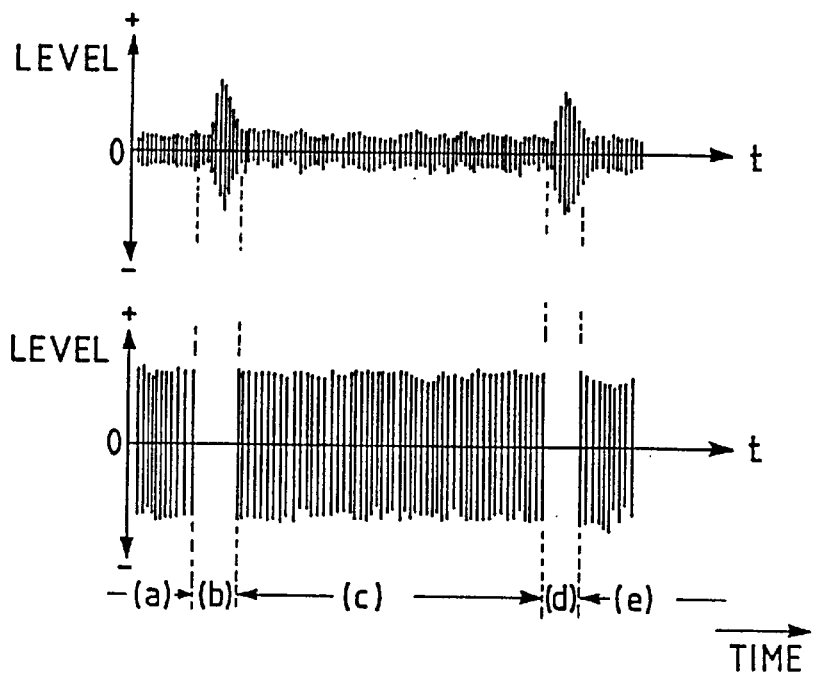
FIG. 18(A)
FIG. 18(B)
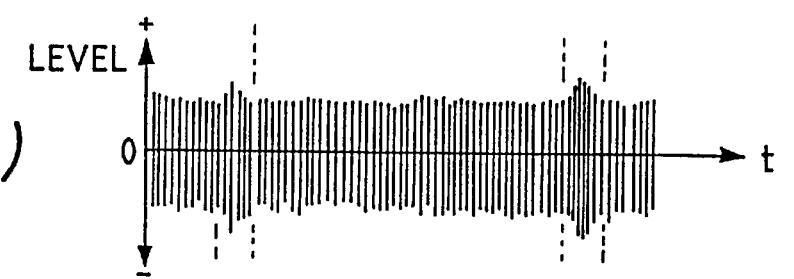
FIG. 19(A)
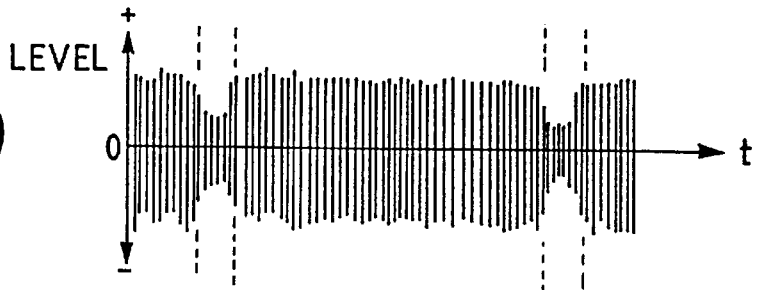
FIG. 19(B)
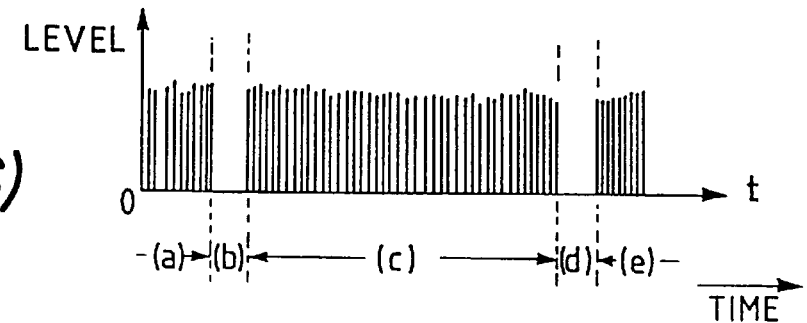
FIG. 19(C)

TIME

— (a) → (b) ← (c) —

TIME

5,832,027

SPREAD SPECTRUM MODULATING AND DEMODULATING APPARATUS FOR TRANSMISSION AND RECEPTION OF FSK AND PSK SIGNALS

This application is a Divisional Application of U.S. patent application Ser. No. 08/340,407, filed Nov. 15, 1994.

BACKGROUND OF THE INVENTION

1. Field of the Invention

This invention relates to a modulating apparatus and a demodulating apparatus. This invention also relates to a spread spectrum modulating apparatus and a spread spectrum demodulating apparatus.

2. Description of the Prior Art

In some of conventional spread spectrum communication systems, a transmitter includes primary and secondary modulators. The primary modulator modulates a carrier with an information signal and thereby derives a primary modulation signal. In general, the modulation executed by the primary modulator is of the FM (frequency modulation) type, the FSK (frequency shift keying) type, or the PSK (phase shift keying) type. The secondary modulator modulates the primary modulation signal with a spread code and thereby derives a secondary modulation signal (a spread spectrum signal). The spread spectrum signal is transmitted from the transmitter to a receiver of the conventional communication systems. The receiver includes a spread code generator producing a spread code which corresponds to the spread code used in the transmitter. The receiver also includes a despreading circuit which despreads the spread spectrum signal with the spread code to recover a primary modulation signal from the spread spectrum signal. The despreading circuit is a demodulator having a function inverse with respect to the function of the secondary modulator in the transmitter. The receiver further includes a second demodulator which recovers an information signal from the primary modulation signal. The second demodulator has a function inverse with respect to the function of the primary modulator in the transmitter.

SUMMARY OF THE INVENTION

It is a first object of this invention to provide an improved modulating apparatus.

It is a second object of this invention to provide an improved demodulating apparatus.

It is a third object of this invention to provide an improved spread spectrum modulating apparatus.

It is a fourth object of this invention to provide an improved spread spectrum demodulating apparatus.

A first aspect of this invention provides a spread spectrum modulating apparatus comprising an oscillator outputting a carrier; a frequency multiplier multiplying a frequency of the carrier by a predetermined integer N1; a frequency divider dividing the frequency of the carrier by a predetermined integer N2; a spread code generator using an output signal of the frequency divider as a clock signal, and generating a spread code in response to the clock signal; a power supply feeding a dc bias; an operation device executing predetermined logic operation between the spread code and a signal coming from a side of the power supply; a switch selectively feeding an input information signal to either the oscillator or the side of the power supply; and means for multiplying an output signal of the operation device and an output signal of the frequency multiplier to execute a spectrum spreading process.

A second aspect of this invention provides a spread spectrum demodulating apparatus comprising a local oscillator; a frequency multiplier multiplying a frequency of an output signal of the local oscillator by a predetermined integer; frequency converting means for multiplying a received spread spectrum modulation signal and an output signal of the frequency multiplier to execute frequency conversion and thereby to convert the received spread spectrum modulation signal into an intermediate-frequency spread spectrum modulation signal; despreading means for multiplying the intermediate-frequency spread spectrum modulation signal and a spread code, and thereby despreading the intermediate-frequency spread spectrum modulation signal into a despread demodulation signal in response to the spread code; a level discriminator discriminating a level of the despread demodulation signal; primary demodulating means for demodulating the despread demodulation signal into a recovered original information signal; a noise level detector detecting a level of noise in an output signal of the primary demodulating means; a selector selecting one of an output signal of the level discriminator and an output signal of the noise level detector; a controller generating a control signal in response to the signal selected by the selector; a PLL circuit contained in the primary demodulating means; a first frequency divider dividing a frequency of an output signal of the PLL circuit by a predetermined integer N1•N2; a second frequency divider dividing a frequency of an output signal of the first local oscillator by a predetermined integer N2; an operation device executing predetermined logic operation between an output signal of the first frequency divider and an output signal of the second frequency divider; a second oscillator outputting a signal approximate to a normal clock signal; a switch selecting one of the output signal of the second oscillator and an output signal of the operation device in response to the control signal generated by the controller; and a spread code generator using the signal selected by the switch as a code generation clock signal, and generating the spread code in response to the code generation clock signal.

A third aspect of this invention provides a demodulating apparatus comprising a PLL circuit reproducing a carrier signal from an input modulation-resultant signal; a phase shifter shifting a phase of the reproduced carrier signal by a predetermined amount; a first switch selecting one of the reproduced carrier signal and an output signal of the phase shifter; a first multiplier multiplying the input modulation-resultant signal and the signal selected by the first switch, and thereby recovering an original information signal from the input modulation-resultant signal; a second multiplier contained in the PLL circuit; and a second switch selecting one of the recovered original information signal and a dc bias, and feeding the selected one to the second multiplier.

A fourth aspect of this invention provides a demodulating apparatus comprising first and second multipliers receiving an input modulation-resultant signal; a PLL circuit including the second multiplier, a loop filter, a voltage-controlled oscillator, and a third multiplier; a phase shifter shifting a phase of an output signal of the oscillator by a predetermined amount; a first switch selecting one of the output signal of the oscillator and an output signal of the phase shifter, and feeding the selected one to the first multiplier; a low pass filter processing an output signal of the first multiplier, and feeding an output signal thereof to the third multiplier; and a second switch selecting one of the output signal of the oscillator and an output signal of the third multiplier, and feeding the selected one to the second multiplier.

A fifth aspect of this invention provides a modulating apparatus comprising an oscillator outputting a carrier; a power supply feeding a dc bias; a multiplier multiplying the carrier and a signal coming from a side of the power supply; and a switch selectively feeding an input information signal to either the oscillator or the side of the power supply.

A sixth aspect of this invention provides a spread spectrum demodulating apparatus comprising a spread code generator generating a spread code; despreading demodulation means for multiplying an incoming spread spectrum modulation signal and the spread code; a carrier reproducing circuit extracting carrier components of an output signal of the despreading modulation means, and reproducing a carrier in response to the extracted carrier components; primary demodulating means for multiplying the reproduced carrier and the output signal of the despreading modulation means to demodulate the output signal of the despreading modulation means into a recovered original information signal; a PLL circuit contained in the carrier reproducing circuit and generating an error signal; and synchronization detecting means for discriminating a noise level of the error signal and outputting a signal for detection of synchronization in response to the discriminated noise level.

A seventh aspect of this invention provides a spread spectrum demodulating apparatus comprising despreading demodulation means for multiplying an incoming spread spectrum modulation signal and a spread code, and thereby despreading the incoming spread spectrum modulation signal into a despread demodulation signal in response to the spread code; a low pass filter passing a multiple-phase PSK signal in the despread demodulation signal; a carrier reproducing circuit reproducing a carrier in response to the multiple-phase PSK signal; primary demodulating means for multiplying the reproduced carrier and the multiple-phase PSK signal, and thereby demodulating the multiple-phase PSK signal into a plurality of demodulation-resultant signals; a PLL circuit contained in the carrier reproducing circuit and generating an error signal; a level discriminator discriminating a noise level of the error signal, and generating a synchronization capturing signal in response to the discriminated noise level; and synchronization capturing means for capturing synchronization in response to the synchronization capturing signal.

BRIEF DESCRIPTION OF THE DRAWINGS

FIGS. 14(A)–14(B), hereinafter collectively referred to as "FIG. 14", are a time-domain diagram of the waveforms of signals in the spread spectrum demodulating apparatus of FIG. 13.

FIGS. 18(A)–18(B), hereinafter collectively referred to as "FIG. 18", are a time-domain diagram of the waveforms of signals in the spread spectrum demodulating apparatus of FIG. 17.

FIGS. 19(A)–18(C), hereinafter collectively referred to as "FIG. 19", are a time-domain diagram of the waveforms of signals in the spread spectrum demodulating apparatus of FIG. 17.

DESCRIPTION OF THE PREFERRED EMBODIMENTS

First Embodiment

Figure 1:
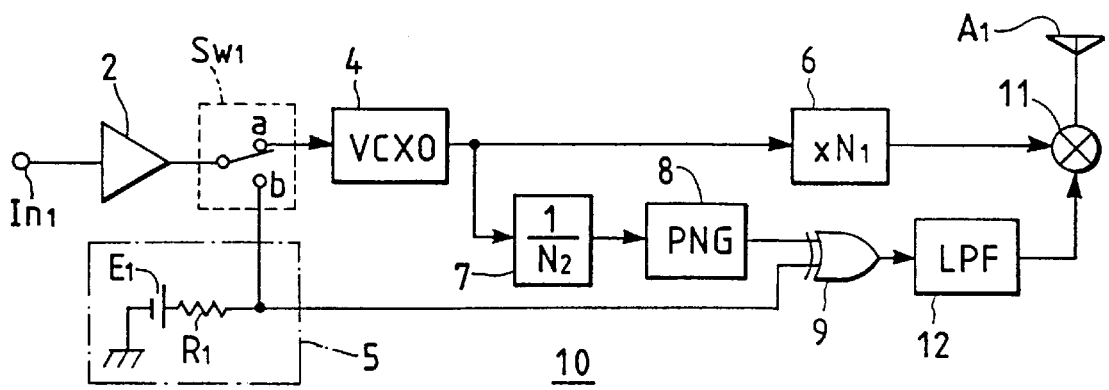
FIG. 1 is a block diagram of a spread spectrum modulating apparatus according to a first embodiment of this invention.

With reference to FIG. 1, a spread spectrum transmitter or a spread spectrum modulating apparatus 10 includes an amplifier 2, a switch Sw1, a voltage-controlled crystal oscillator 4, a dc bias feeder 5, a frequency multiplier 6, a frequency divider 7, a pseudonoise generator (spread code generator) 8, an Exclusive-OR gate 9, a mixer (multiplier) 11, a low pass filter 12, and an antenna A1.

The amplifier 2 has a predetermined low output impedance. The amplifier 2 follows an apparatus input terminal In1. The switch Sw1 has a movable contact and two fixed contacts "a" and "b". The movable contact of the switch Sw1 connects with either the fixed contact "a" or the fixed contact "b" thereof. The movable contact of the switch Sw1 follows the output terminal of the amplifier 2.

The dc bias feeder 5 includes a series combination of a resistor R1 and a dc power supply E1. The negative terminal of the dc power supply E1 is grounded. The positive terminal of the dc power supply E1 is connected to one end of the resistor R1. The other end of the resistor R1 is connected to the fixed contact "b" of the switch Sw1 and a first input terminal of the Exclusive-OR gate 9.

The control terminal of the oscillator 4 follows the fixed contact "a" of the switch Sw1. The output terminal of the oscillator 4 is connected to the input terminal of the frequency multiplier 6 and the input terminal of the frequency divider 7. The output terminal of the frequency multiplier 6 is connected to a first input terminal of the mixer 11. The output terminal of the frequency divider 7 is connected to the clock input terminal of the pseudonoise generator 8. The output terminal of the pseudonoise generator 8 is connected to a second input terminal of the Exclusive-OR gate 9.

The output terminal of the Exclusive-OR gate 9 is connected to the input terminal of the low pass filter 12. The output terminal of the low pass filter 12 is connected to a second input terminal of the mixer 11. The output terminal of the mixer 11 leads to the antenna A1.

Operation of the spread spectrum modulating apparatus 10 of FIG. 1 can be changed between an FSK mode and a PSK mode by the switch Sw1. When the switch Sw1 assumes a first position where its movable contact connects with its fixed contact "a", operation of the modulating apparatus 10 falls into the FSK mode. When the switch Sw1 assumes a second position where its movable contact connects with its fixed contact "b", operation of the modulating apparatus 10 falls into the PSK mode.

During the FSK mode of operation of the modulating apparatus 10, the movable contact of the switch Sw1 connects with the fixed contact "a" thereof, and an analog or digital information signal is fed from the apparatus input terminal In1 to the control terminal of the oscillator 4 via the amplifier 2 and the switch Sw1. The oscillator 4 modulates the frequency of a carrier in response to the information signal, and outputs a modulation-resultant signal. In the case where the information signal is of the digital or bi-level type, the modulation-resultant signal agrees with an FSK modulation signal. In the case where the information signal is of the analog type, the modulation-resultant signal agrees with an FM modulation signal. In the absence of the control responsive to the information signal, the frequency of the carrier is equal to a predetermined frequency, for example, 10.23 MHz. The oscillator 4 executes primary modulation. The modulation-resultant signal outputted by the oscillator 4 is referred to as a primary modulation signal.

During the FSK mode of operation of the modulating apparatus 10, the primary modulation signal is fed from the oscillator 4 to the frequency multiplier 6. The device 6 multiplies the frequency of the primary modulation signal by a predetermined natural number N1 equal to, for example, 154. In other words, the frequency multiplier 6 makes the primary modulation signal into an up-converted primary modulation signal. The up-converted primary modulation signal has a carrier frequency equal to, for example, 1.57542 GHz. The up-converted primary modulation signal is fed from the frequency multiplier 6 to the mixer 11.

During the FSK mode of operation of the modulating apparatus 10, the primary modulation signal is also fed from the oscillator 4 to the frequency divider 7. The device 7 divides the frequency of the primary modulation signal by a predetermined natural number N2 equal to, for example, 10. The output signal of the frequency divider 7 has a carrier frequency equal to, for example, 1.023 MHz. The output signal of the frequency divider 7 is applied to the clock input terminal of the pseudonoise generator 8 as a clock signal. The pseudonoise generator 8 produces a signal representative of a spread code in response to the clock signal. It is preferable that the spread code differs from a C/A (clear and acquisition) code used by GPS (global positioning system) satellites. The spread code signal is fed from the pseudonoise generator 8 to the second input terminal of the Exclusive-OR gate 9. The dc bias feeder 5 applies a predetermined positive dc voltage (high-level signal with a logic state of "1") to the first input terminal of the Exclusive-OR gate 9. The device 9 executes Exclusive-OR operation between the spread code signal and the positive dc voltage, and thereby subjects the spread code signal to phase inversion. Thus, the Exclusive-OR gate 9 makes the spread code signal into a second spread code signal. The second spread code signal is fed from the Exclusive-OR gate 9 to the low pass filter 12. High-frequency components are removed from the second spread code signal by the low pass filter 12. Thus, the low pass filter 12 makes the second spread code signal into a third spread code signal. It should be noted that the third spread code signal is equal in spread code information to the output signal of the pseudonoise generator 8. The third spread code signal is applied to the mixer 11 from the low pass filter 12.

During the FSK mode of operation of the modulating apparatus 10, the mixer 11 multiplies the up-converted primary modulation signal and the third spread code signal, spreading the spectrum of the up-converted primary modulation signal in response to the third spread code signal and thereby generating a spread spectrum signal. Thus, the mixer 11 executes secondary modulation which makes the up-converted primary modulation signal into the spread spectrum signal. The spread spectrum signal is fed from the mixer 11 to the antenna A1, and is radiated thereby.

During the FSK mode of operation of the modulating apparatus 10, the up-converted primary modulation signal is derived from the output signal of the oscillator 4. In addition, the spread code signal produced by the pseudonoise generator 8 is responsive to the clock signal derived from the output signal of the oscillator 4, and the third spread code signal is generated from the spread code signal produced by the pseudonoise generator 8. In other words, the third spread code signal is responsive to the output signal of the oscillator 4. Thus, the up-converted primary modulation signal fed to the mixer 11 and the third spread code signal fed to the mixer 11 have a given synchronized relation with each other so that the mixer 11 can execute a reliable spectrum spreading process.

During the PSK mode of operation of the modulating apparatus 10, the movable contact of the switch Sw1 connects with the fixed contact "b" thereof, and an analog or digital information signal is fed from the apparatus input terminal In1 to the first input terminal of the Exclusive-OR gate 9 via the amplifier 2 and the switch Sw1. Since the switch Sw1 connects the dc voltage feeder 5 to the low-impedance output terminal of the amplifier 2, the dc voltage feeder 5 is disabled so that the information signal is applied to the Exclusive-OR gate 9 as it is. On the other hand, the application of the information signal to the oscillator 4 remains inhibited by the switch Sw1 so that the oscillator 4 outputs a carrier to the frequency multiplier 6 and the frequency divider 7 as a reference signal. The frequency of the carrier is equal to a predetermined frequency, for example, 10.23 MHz.

During the PSK mode of operation of the modulating apparatus 10, the device 6 multiplies the frequency of the reference signal by a predetermined natural number N1 equal to, for example, 154. In other words, the frequency multiplier 6 makes the reference signal into an up-converted carrier. The up-converted carrier has a frequency equal to, for example, 1.57542 GHz. The up-converted carrier is fed from the frequency multiplier 6 to the mixer 11.

During the PSK mode of operation of the modulating apparatus 10, the device 7 divides the frequency of the reference signal by a predetermined natural number N2 equal to, for example, 10. In other words, the frequency divider 7 makes the reference signal into a down-converted reference signal. The down-converted reference signal has a frequency equal to, for example, 1.023 MHz. The down-converted reference signal is applied from the frequency divider 7 to the clock input terminal of the pseudonoise generator 8 as a clock signal. The pseudonoise generator 8 produces a signal representative of a spread code in response to the clock signal. It is preferable that the spread code differs from a C/A (clear and acquisition) code used by GPS (global positioning system) satellites. The spread code signal is fed from the pseudonoise generator 8 to the second input terminal of the Exclusive-OR gate 9. The device 9 executes Exclusive-OR operation between the information signal and the spread code signal, spreading the spectrum of the information signal in response to the spread code signal and thereby generating a spread spectrum modulation signal. In other words, the Exclusive-OR gate 9 executes spread spectrum modulation of the information signal in response to the spread code signal. The spread spectrum modulation signal is fed from the Exclusive-OR gate 9 to the low pass filter 12. High-frequency components are removed from the spread spectrum modulation signal by the low pass filter 12. Thus, the low pass filter 12 makes the spread spectrum modulation signal into a second spread spectrum modulation signal. The second spread spectrum modulation signal is applied to the mixer 11 from the low pass filter 12.

During the PSK mode of operation of the modulating apparatus 10, the mixer 11 multiplies the up-converted carrier and the second spread spectrum modulation signal, and thereby modulates the up-converted carrier in response to the second spread spectrum modulation signal. The mixer 11 outputs the modulation-resultant signal as a final spread spectrum signal. The final spread spectrum signal is equivalent to a signal resulting from sequential execution of PSK modulation and spread spectrum modulation. The final spread spectrum signal is fed from the mixer 11 to the antenna A1, and is radiated thereby.

In the modulating apparatus 10 of FIG. 1, the natural number N1 used by the frequency multiplier 6, the natural number N2 used by the frequency divider 7, the frequency "fk" of the clock signal fed to the pseudonoise generator 8, and the carrier frequency "fc" of the final spread spectrum signal have a relation as "fc=N1•N2•fk".

Figure 2:
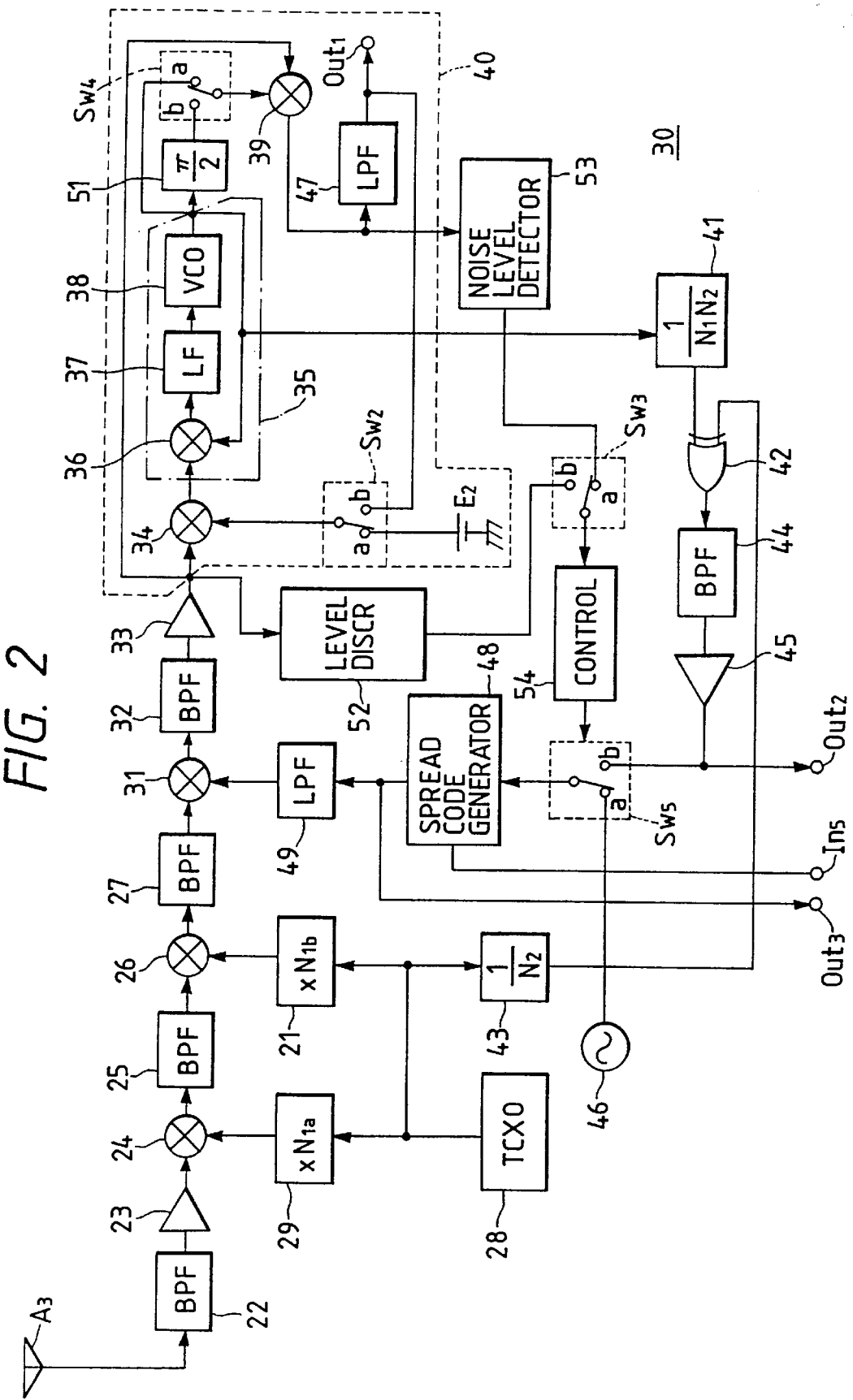
FIG. 2 is a block diagram of a spread spectrum demodulating apparatus in the first embodiment.

FIG. 2 shows a spread spectrum receiver or a spread spectrum demodulating apparatus 30 which can accept a spread spectrum signal transmitted from the spread spectrum transmitter of FIG. 1. As shown in FIG. 2, the spread spectrum demodulating apparatus 30 includes an antenna A3 which is successively followed by a band pass filter 22 and an amplifier 23. The output terminal of the amplifier 23 is connected to a first input terminal of a mixer (multiplier) 24.

The output terminal of a local oscillator 28 is connected to the input terminals of frequency multipliers 21 and 29 and a frequency divider 43. The output terminal of the frequency multiplier 29 is connected to a second input terminal of the mixer 24. The output terminal of the mixer 24 is connected to a first input terminal of a mixer (multiplier) 26 via a band pass filter 25. The output terminal of the frequency multiplier 21 is connected to a second input terminal of the mixer 26. The output terminal of the mixer 26 is connected to a first input terminal of a mixer (multiplier) 31 via a band pass filter 27.

The output terminal of a spread code generator (pseudonoise generator) 48 is connected to a second input terminal of the mixer 31 via a low pass filter 49. The output terminal of the spread code generator 48 is also connected to an apparatus output terminal Out3. The spread code generator 48 is connected to an apparatus input terminal In5. The output terminal of the mixer 31 is successively followed by a band pass filter 32, an amplifier 33, and a primary demodulator 40.

The primary demodulator 40 includes mixers (multipliers) 34 and 39, a PLL (phase locked loop) circuit 35, a phase shifter 51, a low pass filter 47, a dc power supply E2, and switches Sw2 and Sw4. A first input terminal of the mixer 34 is connected to the output terminal of the amplifier 33. The switch Sw2 has a movable contact and two fixed contacts "a" and "b". The movable contact of the switch Sw2 connects with either the fixed contact "a" or the fixed contact "b" thereof. The movable contact of the switch Sw2 leads to a second input terminal of the mixer 34. The fixed contact "a" of the switch Sw2 is connected to the positive terminal of the dc power supply E2. The negative terminal of the dc power supply E2 is grounded. The fixed contact "b" of the switch Sw2 is connected to the output terminal of the low pass filter 47. The output terminal of the mixer 34 is followed by the PLL circuit 35.

The PLL circuit 35 includes a phase comparator (multiplier) 36, a loop filter 37, and a voltage-controlled oscillator 38. A first input terminal of the phase comparator 36 is connected to the output terminal of the mixer 34. A second input terminal of the phase comparator 36 is connected to the output terminal of the oscillator 38. The output terminal of the phase comparator 36 is connected to the control terminal of the oscillator 38 via the loop filter 37.

In the primary demodulator 40, the input terminal of the phase shifter 51 is connected to the output terminal of the oscillator 38. The switch Sw4 has a movable contact and two fixed contacts "a" and "b". The movable contact of the switch Sw4 connects with either the fixed contact "a" or the fixed contact "b" thereof. The fixed contact "a" of the switch Sw4 is connected to the output terminal of the oscillator 38. The fixed contact "b" of the switch Sw4 is connected to the output terminal of the phase shifter 51. The movable contact of the switch Sw4 leads to a first input terminal of the mixer 39. A second input terminal of the mixer 39 is connected to the output terminal of the amplifier 33. The output terminal of the mixer 39 is connected to the input terminal of the low pass filter 47.

The input terminal of a level discriminator 52 is connected to the output terminal of the amplifier 33. The input terminal of a noise level detector 53 is connected to the output terminal of the mixer 39. A switch Sw3 has a movable contact and two fixed contacts "a" and "b". The movable contact of the switch Sw3 connects with either the fixed contact "a" or the fixed contact "b" thereof. The fixed contact "a" of the switch Sw3 is connected to the output terminal of the noise level detector 53. The fixed contact "b" of the switch Sw3 is connected to the output terminal of the level discriminator 52. The movable contact of the switch Sw3 leads to the input terminal of a controller (control signal generator) 54.

A switch Sw5 has a movable contact and two fixed contacts "a" and "b". The movable contact of the switch Sw5 connects with either the fixed contact "a" or the fixed contact "b" thereof. The switch Sw5 has a control terminal connected to the output terminal of the controller 54. The fixed contact "a" of the switch Sw5 is connected to the output terminal of an oscillator 46. The movable contact of the switch Sw5 leads to the clock input terminal of the spread code generator 48.

The input terminal of a frequency divider 41 is connected to the output terminal of the oscillator 38. The output terminal of the frequency divider 41 is connected to a first input terminal of an Exclusive-OR gate 42. A second input terminal of the Exclusive-OR gate 42 is connected to the output terminal of the frequency divider 43. The output terminal of the Exclusive-OR gate 42 is connected to the fixed contact "b" of the switch Sw5 and an apparatus output terminal Out2 via a band pass filter 44 and an amplifier 45.

The demodulation apparatus of FIG. 2 operates as follows. A spread spectrum signal caught by the antenna A3 is fed to the mixer 24 via the band pass filter 22 and the amplifier 23. The local oscillator 28 includes, for example, a temperature-compensated crystal oscillator. The local oscillator 28 outputs a signal having a predetermined frequency. The output signal of the local oscillator 28 is fed to the frequency multipliers 21 and 29. The device 29 multiplies the frequency of the output signal of the local oscillator 28 by a predetermined natural number N1$a$. The output signal of the frequency multiplier 29 is fed to the mixer 24 as a local oscillator signal. The mixer 24 executes frequency conversion of the spread spectrum signal in response to the local oscillator signal, and thereby changes the spread spectrum signal into a first intermediate-frequency spread spectrum signal. In the case where the spread spectrum signal has a carrier frequency equal to or higher than 1.5 GHz, it is preferable that the frequency of the first intermediate-frequency spread spectrum signal is in the range of 200–600 MHz.

The first intermediate-frequency spread spectrum signal is fed from the mixer 24 to the mixer 26 via the band pass filter 25. The device 21 multiplies the frequency of the output signal of the local oscillator 28 by a predetermined natural number N1$b$. The natural number N1$b$ has a predetermined relation with the natural numbers N1a and N1 which is expressed as "N1$a$+N1$b$=N1". It should be noted that the natural number N1 is used by the frequency multiplier 6 in the modulating apparatus 10 of FIG. 1. The output signal of the frequency multiplier 21 is fed to the mixer 26 as a local oscillator signal. The mixer 26 executes frequency conversion of the first intermediate-frequency spread spectrum signal in response to the local oscillator signal, and thereby changes the first intermediate-frequency spread spectrum signal into a second intermediate-frequency spread spectrum signal.

The second intermediate-frequency spread spectrum signal is fed from the mixer 26 to the multiplier 31 via the band pass filter 27. The spread code generator 48 outputs a signal representative of a spread code to the multiplier 31 via the low pass filter 49. The spread code signal corresponds to the spread code signal used in the modulating apparatus 10 of FIG. 1. The multiplier 31 despreads the second intermediate-frequency spread spectrum signal in response to the spread code signal, thereby recovering a primary modulation signal from the second intermediate-frequency spread spectrum signal. The recovered primary modulation signal is also referred to as a despread demodulation signal. The despread demodulation signal is fed from the multiplier 31 to the multiplier 34 via the band pass filter 32 and the amplifier 33. The amplifier 33 executes automatic gain control (AGC) or amplitude limiting control.

Operation of the spread spectrum demodulating apparatus 30 of FIG. 2 can be changed between an FSK mode and a PSK mode by the switches Sw2–Sw4. When each of the switches Sw2–Sw4 assumes a first position where its movable contact connects with its fixed contact "a", operation of the demodulating apparatus 30 falls into the FSK mode. When each of the switches Sw2–Sw4 assumes a second position where its movable contact connects with its fixed contact "b", operation of the demodulating apparatus 30 falls into the PSK mode. It is preferable that the switches Sw2–Sw4 are ganged with each other.

During the FSK mode of operation of the demodulating apparatus 30, a predetermined positive dc voltage (high-level signal with a logic state of "1") is fed from the dc power supply E2 to the multiplier 34 via the switch Sw2. Accordingly, the recovered primary modulation signal passes through the multiplier 34 as it is. Then, the primary modulation signal reaches the phase comparator 36 in the PLL circuit 35. In the PLL circuit 35, the phase comparator 36 receives the output signal of the oscillator 38. The device 36 compares the phases of the primary modulation signal and the output signal of the oscillator 38. The control terminal of the oscillator 38 receives the output signal of the phase comparator 36 via the loop filter 37, so that the frequency of oscillation in the oscillator 38 depends on the output signal of the phase comparator 36. The output signal of the oscillator 38 is fed via the switch Sw4 to the multiplier 39. The output signal of the amplifier 33, that is, the primary modulation signal, is applied to the multiplier 39. The multiplier 39 compares the phases of the primary modulation signal and the output signal of the oscillator 38, thereby demodulating the primary modulation signal into an original information signal with unnecessary high-frequency components. The output signal of the multiplier 39 is fed to the low pass filter 47 so that the unnecessary high-frequency components thereof are removed by the low pass filter 47. Thus, the low pass filter 47 recovers the original information signal. The recovered original information signal is applied from the low pass filter 47 to the apparatus output terminal Out1.

During the PSK mode of operation of the demodulating apparatus 30, the output signal of the low pass filter 47, that is, a recovered original information signal, is fed via the switch Sw2 to the multiplier 34. The device 34 multiplies the recovered primary modulation signal and the output signal of the low pass filter 47. The output signal of the multiplier 34 agrees with a signal from which phase change information disappears. The output signal of the multiplier 34 is fed to the phase comparator 36 in the PLL circuit 35. The PLL circuit 35 serves as a tracking filter, and the output signal of the oscillator 38 agrees with a reproduced carrier of a high quality. The reproduced carrier is applied from the oscillator 38 to the phase shifter 51. The device 51 shifts the phase of the reproduced carrier by 90° C. ($\pi/2$ radian), and thereby makes the reproduced carrier into a second carrier. The second carrier is fed from the phase shifter 51 to the multiplier 39 via the switch Sw4. The output signal of the amplifier 33, that is, the primary modulation signal, is applied to the multiplier 39. The device 39 multiplies the primary modulation signal and the second carrier, thereby executing synchronous demodulation and converting the primary modulation signal into an original information signal with unnecessary high-frequency components. The output signal of the multiplier 39 is fed to the low pass filter 47 so that the unnecessary high-frequency components thereof are removed by the low pass filter 47. Thus, the low pass filter 47 recovers the original information signal. The recovered original information signal is applied from the low pass filter 47 to the apparatus output terminal Out1.

A clock signal fed to the spread code generator 48 will now be described. As previously described, the natural number N1$a$ used by the frequency multiplier 29, the natural number N1$b$ used by the frequency multiplier 21, and the natural number N1 used by the frequency multiplier 6 in the modulating apparatus 10 of FIG. 1 have a relation expressed by "N1$a$+N1$b$=N1". In the modulating apparatus 10 of FIG. 1, the natural number N1 used by the frequency multiplier 6, the natural number N2 used by the frequency divider 7, the frequency "fk" of the clock signal fed to the pseudonoise generator 8, and the carrier frequency "fc" of the final spread spectrum signal have a relation as "fc=N1•N2•fk". Thus, the carrier frequency "fi" of the primary modulation signal, that is, the output signal of the amplifier 33, is expressed by the following equation.

$$\begin{aligned} fi &= fc - (N1a + N1b) \cdot fo \\ &= N1 \cdot N2 \cdot fk - N1 \cdot fo \end{aligned} \quad (1)$$

where "fo" denotes the frequency of the output signal of the local oscillator 28. The equation (1) is rewritten into an equation as follows.

$$fk = \{fi/(N1 \cdot N2)\} + fo/N2 \quad (2)$$

The frequency "fkr" of the clock signal fed to the spread code generator 48 is set equal to the transmitter-side clock frequency "fk" by referring to the equation (2).

Specifically, a sub frequency "fi/(N1•N2)" is generated by the frequency divider 41 while a sub frequency "fo/N2" is generated by the frequency divider 43. The frequency divider 41 receives the output signal of the oscillator 38 which has the frequency "fi". The device 41 divides the frequency "fi" of the output signal of the oscillator 38 by a predetermined natural number equal to the product of the natural numbers N1 and N2. The output signal of the frequency divider 41 which has a frequency "fi/(N1•N2)" is applied to a first input terminal of the Exclusive-OR gate 42. The frequency divider 43 receives the output signal of the local oscillator 28 which has the frequency "fo". The device 43 divides the frequency "fo" of the output signal of the local oscillator 28 by the natural number N2. The output signal of the frequency divider 43 which has a frequency "fo/N2" is applied to a second input terminal of the Exclusive-OR gate 42. The device 42 executes Exclusive-OR operation between the output signals of the frequency dividers 41 and 43, thereby outputting a signal having a frequency equal to the sum of the frequencies "fi/(N1•N2)" and "fo/N2". The output signal of the Exclusive-OR gate 42 is successively processed by the band pass filter 44 and the amplifier 45, being made into a reproduced clock signal having a frequency "fkr" equal to the sum of the frequencies "fi/(N1•N2)" and "fo/N2". The reproduced clock signal is applied from the amplifier 45 to the apparatus output terminal Out2 and the fixed contact "b" of the switch Sw5.

The switch Sw5 is controlled by the controller 54. The combination of the switch Sw5 and the controller 54 is designed so that the movable contact of the switch Sw5 initially connects with its fixed contact "a". Accordingly, during an initial stage of operation of the demodulating apparatus 30 of FIG. 2, the movable contact of the switch Sw5 connects with the fixed contact "a" thereof so that the output signal of the oscillator 46 is fed via the switch Sw5 to the spread code generator 48 as a clock signal. Thus, in this case, the spread code generator 48 produces the spread code signal in response to the clock signal, that is, the output signal of the oscillator 46. The frequency "fs" of the output signal of the oscillator 46 is variable in the range of fk±$\Delta$f where "$\Delta$f" denotes a predetermined value. The frequency "fs" of the output signal of the oscillator 46 continuously varies between the limits fk−$\Delta$f and fk+$\Delta$f as time goes by. Therefore, the length of the spread code represented by the output signal of the spread code generator 48 varies in accordance with the variation in the frequency "fs" of the output signal of the oscillator 46. Regarding the despread demodulation signal (primary modulation signal), a low-level state indicative of a noncorrelation is replaced by a high-level state indicative of a close correlation in a burst manner at a certain moment as the length of the spread code (that is, the frequency "fs" of the output signal of the oscillator 46) varies. This change in the despread demodulation signal means an agreement in clock signal frequency or spread code length between the transmitter 10 and the receiver 30. The change in the despread demodulation signal is sensed by the level discriminator 52 and the noise level detector 53.

During the FSK mode of operation of the demodulating apparatus 30, the above-indicated change in the despread demodulation signal causes a minimum of the spread noise level of the recovered information signal. The noise level detector 53 receives the output signal of the multiplier 39, that is, the recovered information signal. The device 53 detects a minimum of the spread noise level of the recovered information signal, and informs the controller 54 of the detection of the minimum via the switch Sw3. The controller 54 includes a flip-flop or a combination of a switch and a dc power source which generates a binary signal. The binary signal changes in logic state when the controller 54 is informed of the detection of the minimum. The controller 54 outputs the binary signal to the switch Sw5 as a switch change signal. When the binary signal changes in logic state as previously described, the movable contact of the switch Sw5 connects with the fixed contact "b" thereof so that the output signal of the amplifier 45 (the reproduced clock signal) starts to be fed to the spread code generator 48 via the switch Sw5 as a clock signal. Accordingly, the spread code generator 48 starts to produce the spread code signal in response to the output signal of the amplifier 45. In this way, there occurs the establishment of a good synchronization (agreement) in spread code length between the transmitter 10 and the receiver 30. During a later time, the synchronization (agreement) in spread code length remains maintained.

During the PSK mode of operation of the demodulating apparatus 30, the output signal of the amplifier 33 (the despread modulation signal) is applied to the level discriminator 52, and the above-indicated change in the despread demodulation signal is directly detected by the level discriminator 52. The level discriminator 52 informs the controller 54 of the detection of the change via the switch Sw3.

The binary signal generated in the controller 54 changes in logic state when the controller 54 is informed of the detection of the change. The controller 54 outputs the binary signal to the switch Sw5 as a switch change signal. When the binary signal changes in logic state as previously described, the movable contact of the switch Sw5 connects with the fixed contact "b" thereof so that the output signal of the amplifier 45 (the reproduced clock signal) starts to be fed to the spread code generator 48 via the switch Sw5 as a clock signal. Accordingly, the spread code generator 48 starts to produce the spread code signal in response to the output signal of the amplifier 45. In this way, there occurs the establishment of a good synchronization (agreement) in spread code length between the transmitter 10 and the receiver 30. During a later time, the synchronization (agreement) in spread code length remains maintained.

It should be noted that the combination of the mixers 24 and 26, the band pass filter 25, and the frequency multipliers 21 and 29 may be replaced by the combination of a single mixer and a single frequency multiplier which has the function of multiplying a frequency by the predetermined natural number N1.

Figure 3:
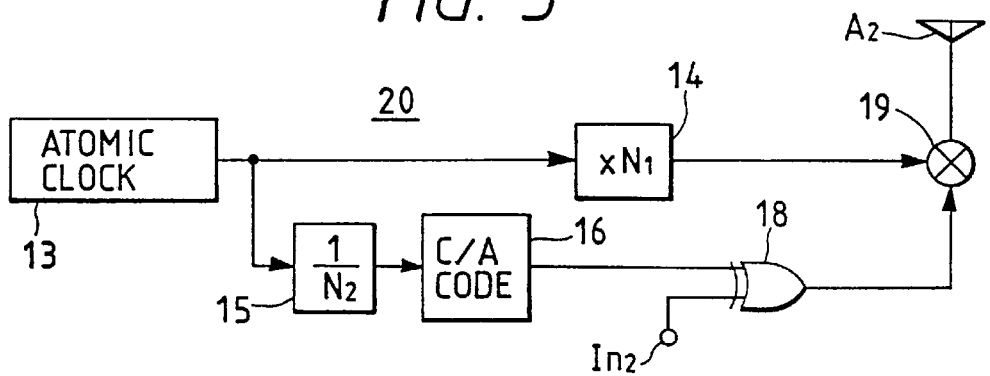
FIG. 3 is a block diagram of a spread spectrum modulating apparatus.

The spread spectrum receiver (spread spectrum demodulating apparatus) 30 can also accept a spread spectrum signal transmitted from a spread spectrum transmitter (spread spectrum modulating apparatus) 20 which is shown in FIG. 3. The spread spectrum modulating apparatus 20 is generally mounted on a GPS satellite.

As shown in FIG. 3, the modulating apparatus 20 includes an atomic clock 13 outputting a reference signal having a frequency of 10.23 MHz. The atomic clock 13 feeds the reference signal to a frequency multiplier 14 and a frequency divider 15. The device 14 multiplies the frequency of the reference signal by the predetermined natural number N1 (N1=154), and thereby generates a carrier having a frequency of 1.57542 GHz. The frequency multiplier 14 outputs the carrier to a first input terminal of a mixer (multiplier) 19.

The device 15 divides the frequency of the reference signal by the predetermined natural number N2 (N2=10), and thereby converts the reference signal into a clock signal. The frequency divider 15 outputs the clock signal to a C/A (clear and acquisition) code generator 16. The clock signal corresponds to a chip length of 1,023. The C/A code generator 16 produces a signal representative of a C/A code (spread code) in response to the clock signal. The C/A code generator 16 outputs the C/A code signal to a first input terminal of an Exclusive-OR gate 18. A second input terminal of the Exclusive-OR gate 18 receives a signal representative of a navigation message via an apparatus input terminal In2. It should be noted that the navigation message is generated in response to a clock signal having a frequency of 50 Hz. The device 18 executes Exclusive-OR operation between the C/A code signal and the navigation message signal, thereby implementing message modulation. The output signal of the Exclusive-OR gate 18 is fed to a second input terminal of the mixer 19.

The mixer 19 multiplies the carrier and the output signal of the Exclusive-OR gate 18, and thereby modulates the carrier in response to the output signal of the Exclusive-OR gate 18. The mixer 19 combines the carrier and the output signal of the Exclusive-OR gate 18 into a spread spectrum signal. The spread spectrum signal is fed from the mixer 19 to an antenna A2, and is radiated thereby.

In the case where the spread spectrum receiver (spread spectrum demodulating apparatus) 30 of FIG. 2 is set to accept a spread spectrum signal transmitted from the spread spectrum transmitter (spread spectrum modulating apparatus) 20 of FIG. 3, the spread code generator 48 in FIG. 2 is modified to produce a signal of a C/A code (spread code). To reproduce an atomic clock frequency, a frequency multiplier (not shown) is used which multiplies the frequency of the output signal from the apparatus output terminal Out2 by a factor of 10. The C/A code signal can be outputted via the apparatus output terminal Out3. Desired one of different types of the C/A code signal can be selected by feeding a control signal to the spread code generator 48 via the apparatus input terminal In5.

Second Embodiment

Figure 4:
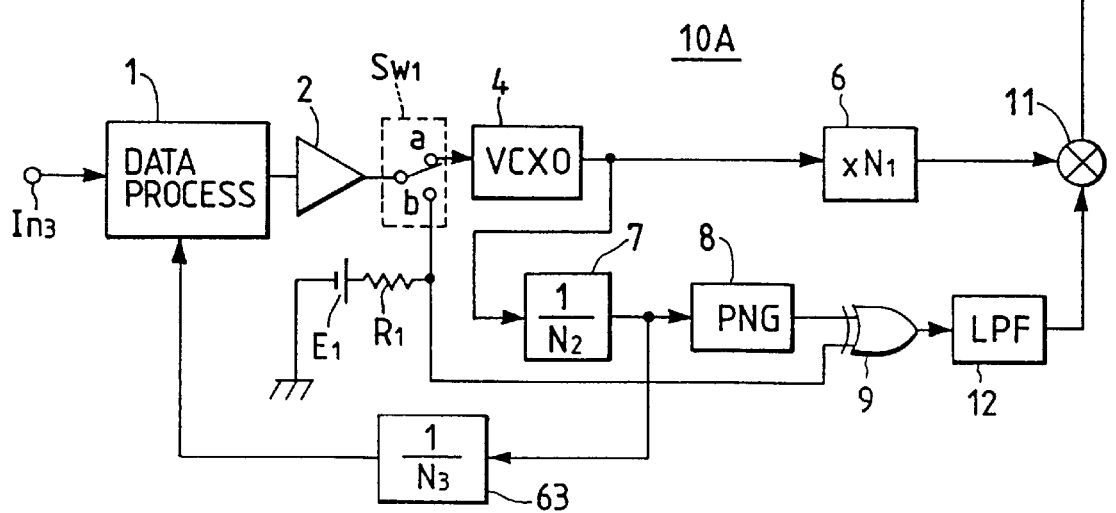
FIG. 4 is a block diagram of a spread spectrum modulating apparatus according to a second embodiment of this invention.

FIG. 4 shows a spread spectrum modulating apparatus (spread spectrum transmitter) 10A which is similar to the modulating apparatus 10 of FIG. 1 except that a data processor 1 and a frequency divider 63 are additionally provided. The data processor 1 follows an apparatus input terminal In3 and precedes an amplifier 2. The input terminal of the frequency divider 63 is connected to the output terminal of a frequency divider 7. The output terminal of the frequency divider 63 is connected to the clock input terminal of the data processor 1.

The device 63 divides the frequency of the output signal of the frequency divider 7 by a predetermined natural number N3, and thereby converts the output signal of the frequency divider 7 into a clock signal. The frequency divider 63 feeds the clock signal to the data processor 1. An information signal having a digital form is applied to the data processor 1 via the apparatus input terminal In3. The device 1 processes the information signal into corresponding data in response to the clock signal. The data processor 1 outputs the data to the amplifier 2.

A clock signal fed to a pseudonoise generator 8 from the frequency divider 7 and the clock signal used by the data processor 1 are in a fixed synchronous relation or a fixed frequency relation determined by the natural number N3. Regarding a PSK mode of operation of the modulating apparatus 10A of FIG. 4, it is preferable that a 1-bit period related to the output data from the data processor 1 is equal to the length of a spread code or equal to the product of a predetermined integer and the spread code length. In this case, at a receiver side, the level of leaked spread code components in a recovered information signal can be reduced.

In the case where the spread code length corresponds to 127 chips, the natural number N3 is equal to 127 or equal to the product of 127 and a given natural number.

Third Embodiment

Figure 5:
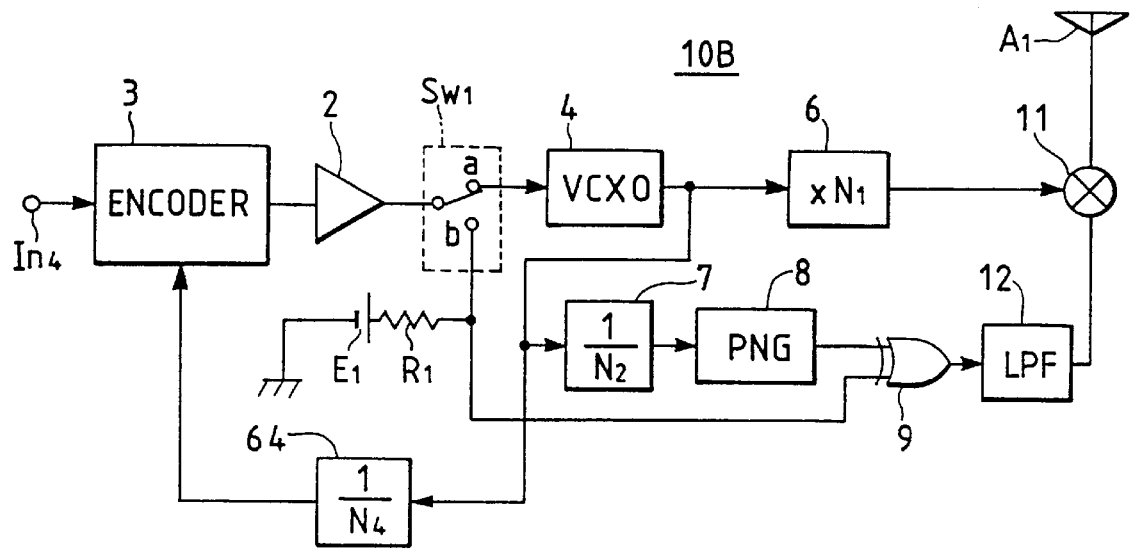
FIG. 5 is a block diagram of a spread spectrum modulating apparatus according to a third embodiment of this invention.

FIG. 5 shows a spread spectrum modulating apparatus (spread spectrum transmitter) 10B which is similar to the modulating apparatus 10 of FIG. 1 except that an encoder 3 and a frequency divider 64 are additionally provided. The encoder 3 follows an apparatus input terminal In4 and precedes an amplifier 2. The input terminal of the frequency divider 64 is connected to the output terminal of a voltage-controlled crystal oscillator 4. The output terminal of the frequency divider 64 is connected to the clock input terminal of the encoder 3.

The device 64 divides the frequency of the output signal of the oscillator 4 by a predetermined natural number N4, and thereby converts the output signal of the oscillator 4 into a clock signal. The frequency divider 64 feeds the clock signal to the encoder 3. An information signal having an analog form is applied to the encoder 3 via the apparatus input terminal In4. The encoder 3 converts the analog information signal into a corresponding digital signal of a given code in response to the clock signal. The encoder 3 outputs the digital signal to the amplifier 2.

A clock signal fed to a pseudonoise generator 8 from a frequency divider 7 and the clock signal used by the encoder 3 are in a fixed synchronous relation or a fixed frequency relation determined by the natural number N4. In the case where a spread code length corresponds to 127 chips, the natural number N4 is equal to 127•N2 or equal to the product of a given natural number and 127•N2.

It should be noted that the encoder 3 may be replaced by an A/D converter.

Fourth Embodiment

Figure 6:
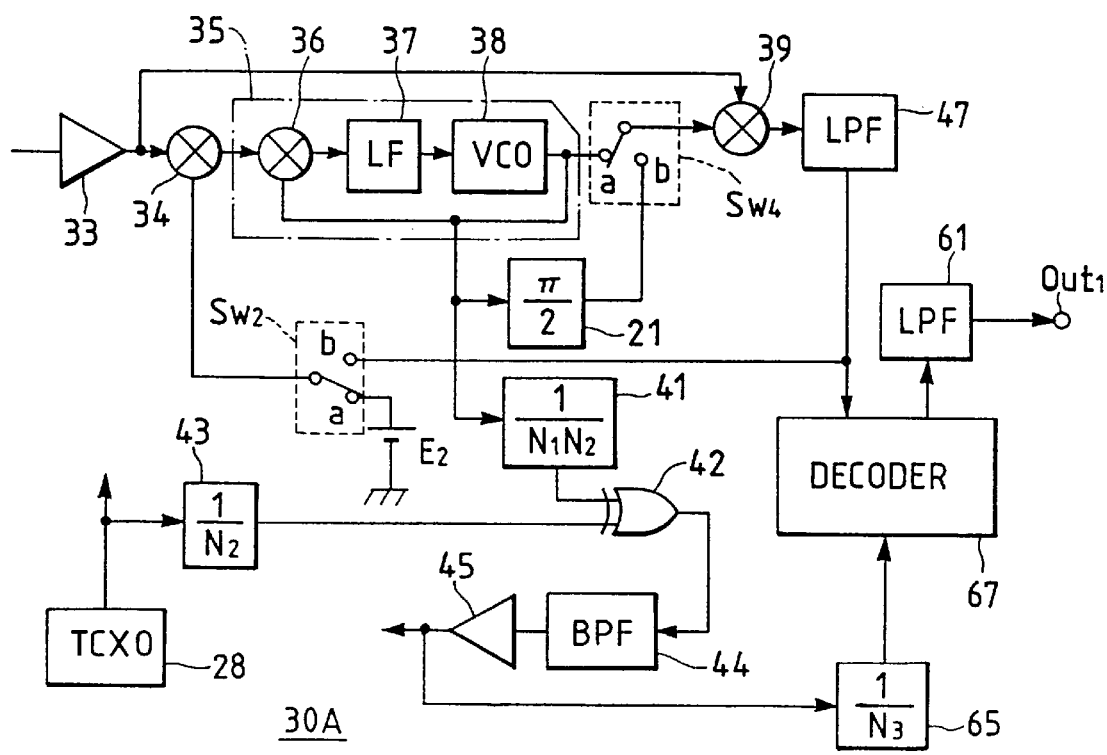
FIG. 6 is a block diagram of a portion of a spread spectrum demodulating apparatus according to a fourth embodiment of this invention.

FIG. 6 shows a spread spectrum demodulating apparatus (spread spectrum receiver) 30A which is similar to the demodulating apparatus 30 of FIG. 2 except that a low pass filter 61, a frequency divider 65, and a decoder 67 are additionally provided. The input terminal of the decoder 67 is connected to the output terminal of a low pass filter 47. The output terminal of the decoder 67 is connected to an apparatus output terminal Out1 via the low pass filter 61. The input terminal of the frequency divider 65 is connected to the output terminal of an amplifier 45. The output terminal of the frequency divider 65 is connected to the clock input terminal of the decoder 67.

The device 65 divides the frequency of the output signal of the amplifier 45 (that is, the frequency of a clock signal for the generation of a spread code) by the predetermined natural number N3, and thereby converts the output signal of the amplifier 45 into a clock signal. The frequency divider 65 feeds the clock signal to the decoder 67. The device 67 decodes the output signal of the low pass filter 47 into an original information signal in response to the clock signal. The information signal is fed from the decoder 67 to the apparatus output terminal Out1 via the low pass filter 61.

Generally, the decoder 67 has a function inverse with respect to the function of an encoder in a transmitter side. It should be noted that the decoder 67 may be replaced by a data processor or a D/A converter corresponding to a data processor or an A/D converter in a transmitter side.

Fifth Embodiment

Figure 7:
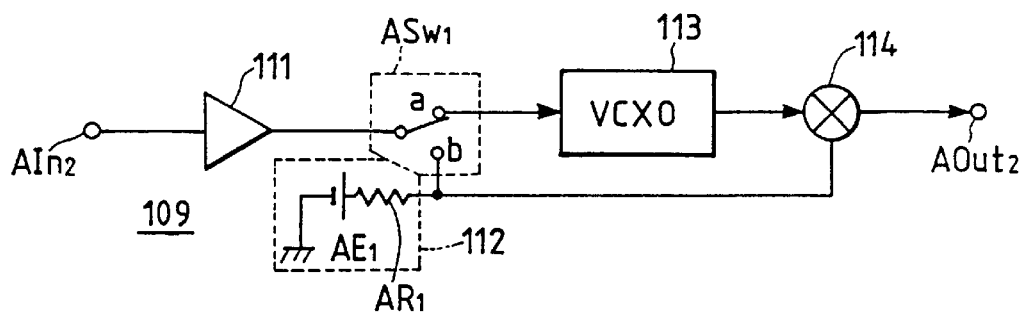
FIG. 7 is a block diagram of a modulating apparatus according to a fifth embodiment of this invention.

With reference to FIG. 7, a modulating apparatus 109 includes an amplifier 111, a switch ASw1, a dc bias feeder 112, a voltage-controlled crystal oscillator 113, and a multiplier (mixer) 114.

The amplifier 111 has a predetermined low output impedance. The amplifier 111 follows an apparatus input terminal AIn2. The switch ASw1 has a movable contact and two fixed contacts "a" and "b". The movable contact of the switch ASw1 connects with either the fixed contact "a" or the fixed contact "b" thereof. The movable contact of the switch ASw1 follows the output terminal of the amplifier 111.

The dc bias feeder 112 includes a series combination of a resistor AR1 and a dc power supply AE1. The negative terminal of the dc power supply AE1 is grounded. The positive terminal of the dc power supply AE1 is connected to one end of the resistor AR1. The other end of the resistor AR1 is connected to the fixed contact "b" of the switch ASw1 and a first input terminal of the multiplier 114.

The control terminal of the oscillator 113 follows the fixed contact "a" of the switch ASw1. The output terminal of the oscillator 113 is connected to a second input terminal of the multiplier 114. The output terminal of the multiplier 114 is connected to an apparatus output terminal AOut2.

Operation of the modulating apparatus 109 of FIG. 7 can be changed between an FSK mode and a PSK mode by the switch ASw1. The switch ASw1 is of the manually-operated type or the electrically-controlled type. When the switch ASw1 assumes a first position where its movable contact connects with its fixed contact "a", operation of the modulating apparatus 109 falls into the FSK mode. When the switch ASw1 assumes a second position where its movable contact connects with its fixed contact "b", operation of the modulating apparatus 109 falls into the PSK mode.

During the FSK mode of operation of the modulating apparatus 109, the movable contact of the switch ASw1 connects with the fixed contact "a" thereof, and an information signal "d(t)" is fed from the apparatus input terminal AIn1 to the control terminal of the oscillator 113 via the amplifier 111 and the switch ASw1. The oscillator 113 executes FSK modulation of the information signal "d(t)" by using signals having different fixed frequencies "$\omega 1$" and "$\omega 2$" respectively. When the information signal "d(t)" assumes a state of +1, the output signal of the oscillator 113 has a first form Sm(t). When the information signal "d(t)" assumes a state of −1 or 0, the output signal of the oscillator 113 has a second form Sv(t). The first and second forms Sm(t) and Sv(t) are expressed as follows.

$$Sm(t) = A \cdot \cos \omega 1 t \quad (3)$$

$$Sv(t) = A \cdot \cos \omega 2 t \quad (4)$$

where "A" denotes the amplitude of the output signal of the oscillator 113. The output signal Sm(t) or Sv(t) of the oscillator 113 is fed to the second input terminal of the multiplier 114 as an FSK modulation signal.

During the FSK mode of operation of the modulating apparatus 109, the dc bias feeder 112 applies a predetermined positive dc voltage (high-level signal with a logic state of "1") to the first input terminal of the multiplier 114. Thus, the multiplier 114 serves as a simple amplifier or a buffer, and the FSK modulation signal Sm(t) or Sv(t) passes through the multiplier 114 as it is. Then, the FSK modulation signal Sm(t) or Sv(t) reaches the apparatus output terminal AOut2.

During the PSK mode of operation of the modulating apparatus 109, the movable contact of the switch ASw1 connects with the fixed contact "b" thereof, and an information signal "d(t)" is fed from the apparatus input terminal AIn2 to the first input terminal of the multiplier 114 via the amplifier 111 and the switch ASw1. Since the switch ASw1 connects the dc voltage feeder 112 to the low-impedance output terminal of the amplifier 111, the dc voltage feeder 112 is disabled so that the information signal "d(t)" is applied to the multiplier 114 as it is.

During the PSK mode of operation of the modulating apparatus 109, the application of the information signal "d(t)" to the oscillator 113 remains inhibited by the switch ASw1 so that the oscillator 113 outputs a carrier of a fixed frequency "co" to the second input terminal of the multiplier 114. The device 114 multiplies the information signal "d(t)" and the carrier "coscot", and mixes them into a PSK modulation signal Sp(t) expressed as follows.

$$Sp(t) = A \cdot d(t) \cdot \cos \omega t \quad (5)$$

The PSK modulation signal Sp(t) is applied to the apparatus output terminal AOut2 from the multiplier 114.

Figure 8:
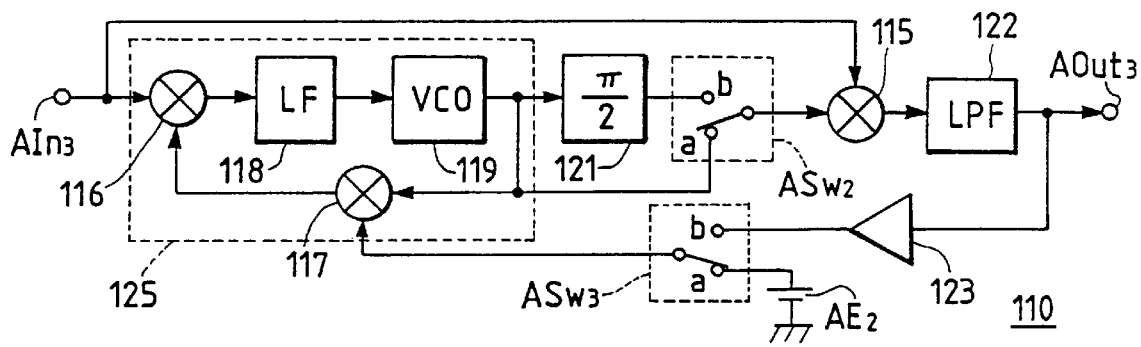
FIG. 8 is a block diagram of a demodulating apparatus in the fifth embodiment.

FIG. 8 shows a demodulating apparatus 110 which can handle the output signal of the modulating apparatus 109 of FIG. 7. The modulating apparatus 109 and the demodulating apparatus 110 may be provided in a transceiver for 2-way communication with other transceivers each having a combination of similar modulating and demodulating apparatuses.

As shown in FIG. 8, the demodulating apparatus 110 includes multipliers (mixers) 115, 116, and 117, a loop filter 118, a voltage-controlled oscillator 119, a phase shifter 121, a low pass filter 122, an amplifier 123, a dc power supply AE2, and switches ASw2 and ASw3. The multipliers 116 and 117, the loop filter 118, and the oscillator 119 compose a PLL circuit 125.

A first input terminal of the multiplier 116 leads from an apparatus input terminal AIn3. A second input terminal of the multiplier 116 is connected to the output terminal of the multiplier 117. The output terminal of the multiplier 116 is connected to the control terminal of the oscillator 119 via the loop filter 118. The input terminal of the phase shifter 121 is connected to the output terminal of the oscillator 119. The switch ASw2 has a movable contact and two fixed contacts "a" and "b". The movable contact of the switch ASw2 connects with either the fixed contact "a" or the fixed contact "b" thereof. The fixed contact "a" of the switch ASw2 is connected to the output terminal of the oscillator 119. The fixed contact "b" of the switch ASw2 is connected to the output terminal of the phase shifter 121. The movable contact of the switch ASw2 leads to a first input terminal of the multiplier 115. A second input terminal of the multiplier 115 leads from the apparatus input terminal AIn3. The output terminal of the multiplier 115 is connected to the input terminal of the low pass filter 122. The output terminal of the low pass filter 122 is connected to an apparatus output terminal AOut3. The output terminal of the low pass filter 122 is also connected to the input terminal of the amplifier 123. The switch ASw3 has a movable contact and two fixed contacts "a" and "b". The movable contact of the switch ASw3 connects with either the fixed contact "a" or the fixed contact "b" thereof. The fixed contact "a" of the switch ASw3 is connected to the positive terminal of the dc power supply AE2. The negative terminal of the dc power supply AE2 is grounded. The fixed contact "b" of the switch ASw3 is connected to the output terminal of the amplifier 123. The movable contact of the switch ASw3 leads to a first input terminal of the multiplier 117. A second input terminal of the multiplier 117 is connected to the output terminal of the oscillator 119.

Operation of the demodulating apparatus 110 of FIG. 8 can be changed between an FSK mode and a PSK mode by the switches ASw2 and ASw3. When each of the switches ASw2 and ASw3 assumes a first position where its movable contact connects with its fixed contact "a", operation of the demodulating apparatus 110 falls into the FSK mode. When each of the switches ASw2 and ASw3 assumes a second position where its movable contact connects with its fixed contact "b", operation of the demodulating apparatus 110 falls into the PSK mode. It is preferable that the switches ASw2 and ASw3 are ganged with each other.

During the PSK mode of operation of the demodulating apparatus 110, an incoming PSK modulation signal Sp(t) is fed to the multipliers 115 and 116 via the apparatus input terminal AIn3. When the carrier level "A" of the PSK modulation signal Sp(t) corresponds to "1", the PSK modulation signal Sp(t) is expressed as follows.

$$Sp(t)=d(t) \cdot \cos(\omega t+\phi 1) \tag{6}$$

where "$\phi 1$" denotes a phase delay, and "d(t)" denotes an information signal of the bi-value type which can be changed between "+1" and "−1 (or 0)". The oscillator 119 outputs a reproduced carrier expressed as "$\sin(\omega t+\phi 2)$" where "$\phi 2$" denotes a phase delay. The reproduced carrier is fed from the oscillator 119 to the multiplier 117 and the phase shifter 121. The device 121 shifts the phase of the reproduced carrier by 90° C. ($\pi/2$ radian), and thereby makes the reproduced carrier into a second carrier expressed as "$\cos(\omega t+\phi 2)$". The second carrier is fed from the phase shifter 121 to the multiplier 115 via the switch ASw2. The multiplier 115 receives the incoming PSK modulation signal Sp(t) via the apparatus input terminal AIn3. The device 115 multiplies the PSK modulation signal and the second carrier, thereby outputting a signal Sd(t) expressed as follows.

$$Sd(t)=d(t) \cdot \{\cos(2\omega t+\phi 1+\phi 2)+\cos(\phi 1-\phi 2)\}/2 \tag{7}$$

The output signal Sd(t) of the multiplier 115 is applied to the low pass filter 122. High-frequency components are removed from the signal Sd(t) by the low pass filter 122 so that a recovered information signal "d(t)" appears at the output terminal of the low pass filter 122. The recovered information signal "d(t)" is applied to the apparatus output terminal AOut3 from the low pass filter 122.

During the PSK mode of operation of the demodulating apparatus 110, the recovered information signal "d(t)" is fed from the low pass filter 122 to the multiplier 117 via the amplifier 123 and the switch ASw3. As previously described, the multiplier 117 receives the reproduced carrier "$\sin(\omega t+\phi 2)$" from the oscillator 119. The device 117 multiplies the recovered information signal "d(t)" and the reproduced carrier "$\sin(\omega t+\phi 2)$", and thereby outputs a signal expressed as "$d(t) \cdot \sin(\omega t+\phi 2)$". The output signal of the multiplier 117 is fed to the multiplier 116. The device 116 multiplies the incoming PSK modulation signal Sp(t) and the output signal of the multiplier 117, and thereby outputs a signal Ep(t) expressed as follows.

$$\begin{aligned} Ep(t) &= \{d(t)^2 \cdot \sin(2\omega t+\phi 1+\phi 2) - d(t)^2 \cdot \sin(\phi 1-\phi 2)\}/2 \\ &= \{\sin(2\omega t+\phi 1+\phi 2) - \sin(\phi 1-\phi 2)\}/2 \end{aligned} \tag{8}$$

It should be noted that the value "$d(t)^2$" is equal to "1". The output signal Ep(t) of the multiplier 116 is applied to the loop filter 118. High-frequency components are removed from the signal Ep(t) by the loop filter 118 so that a phase error signal "$-\sin(\phi 1-\phi 2)$" appears at the output terminal of the loop filter 118. When the difference between the phase factors "$\phi 1$" and "$\phi 2$" is small, the value "$-\sin(\phi 1-\phi 2)$" is approximated to a value of "$-(\phi 1-\phi 2)$". The phase error signal is fed from the loop filter 118 to the oscillator 119 as a control signal. The oscillator 119 outputs a signal having a frequency which depends on the phase error signal. The output signal of the oscillator 119 agrees with a reproduced carrier having an angular frequency "$\omega$". As understood from the equation (8), the multiplier 116 generates a signal dependent on the phase difference "$\phi 1-\phi 2$" between the two received signals. Thus, the multiplier 116 serves as a phase comparator for detecting a phase difference.

During the FSK mode of operation of the demodulating apparatus 110, an incoming FSK modulation signal is fed to the multipliers 115 and 116 via the apparatus input terminal AIn3. When an information signal "d(t)" assumes a state of +1, the FSK modulation signal has a first form Sm(t). When the information signal "d(t)" assumes a state of −1 or 0, the FSK modulation signal has a second form Sv(t). In the case where the carrier level "A" of the FSK modulation signal corresponds to "1", the first and second forms Sm(t) and Sv(t) are expressed as follows.

$$Sm(t)=\cos(\omega 1 t+\phi 1) \tag{9}$$

$$Sv(t)=\cos(\omega 2t+\phi 2) \qquad (10)$$

where "φ1" and "φ2" denote phase delays. A predetermined positive dc voltage (high-level signal with a logic state of "1") is fed to the multiplier 117 from the dc power supply AE2 via the switch ASw3, and hence the multiplier 117 serves as a simple amplifier or a buffer. Thus, the PLL circuit 125 composed of the multipliers 116 and 117, the loop filter 118, and the oscillator 119 is enabled so that the frequency of the output signal of the oscillator 119 will follow the frequency of the FSK modulation signal Sm(t) or Sv(t). Therefore, the output signal of the oscillator 119 has a form Sm'(t) or Sv'(t) in response to the FSK modulation signal Sm(t) or Sv(t).

The forms Sm'(t) or Sv'(t) of the output signal of the oscillator 119 are expressed as follows.

$$Sm'(t)=\cos(\phi 1t+\phi 3) \qquad (11)$$

$$Sv'(t)=\cos(\phi 2t+\phi 4) \qquad (12)$$

where "φ3" and "φ4" denote phase delays.

During the FSK mode of operation of the demodulating apparatus 110, the output signal Sm'(t) or Sv'(t) of the oscillator 119 is fed to the multiplier 115 via the switch ASw2. The device 115 multiplies the FSK modulation signal Sm(t) or Sv(t) and the output signal Sm'(t) or Sv'(t) of the oscillator 119, thereby outputting a signal having components expressed by "−sin(φ1−φ3)" or "−sin(φ2−φ4)". The output signal of the multiplier 115 is applied to the low pass filter 122. Unnecessary high-frequency components are removed from the output signal of the multiplier 115 by the low pass filter 122 so that a phase comparison signal approximated to "−(φ1−φ3)" or "−(φ2−φ4)" appears at the output terminal of the low pass filter 122. The phase comparison signal "−(φ1−φ3)" or "−(φ2−φ4)" is applied to the apparatus output terminal AOut3 from the low pass filter 122.

Sixth Embodiment

Figure 9:
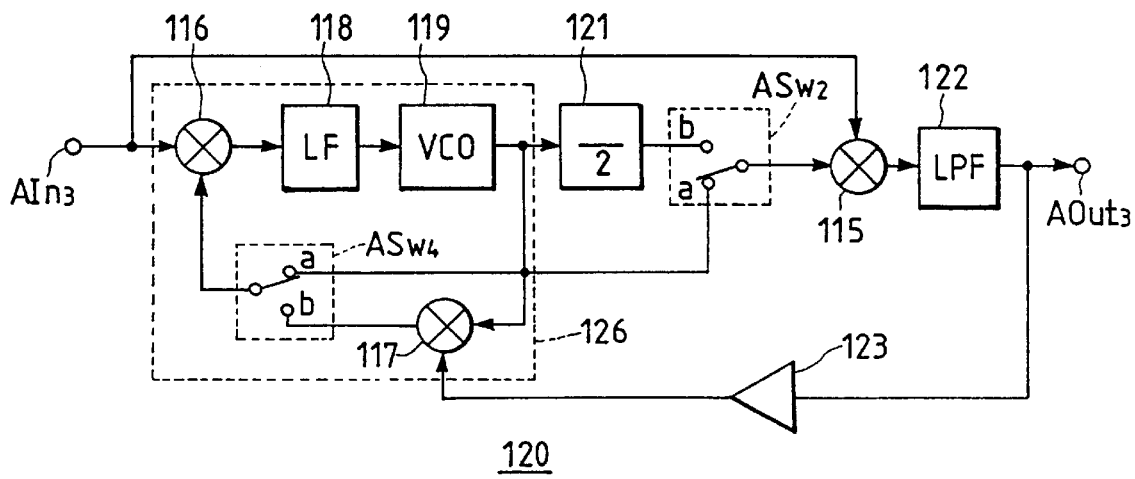
FIG. 9 is a block diagram of a demodulating apparatus according to a sixth embodiment of this invention.

FIG. 9 shows a demodulating apparatus 120 which is similar to the demodulating apparatus 110 of FIG. 8 except for design changes indicated hereinafter. As shown in FIG. 9, the demodulating apparatus 120 includes a switch ASw4. The switch ASw3 (see FIG. 8) and the dc power supply AE2 (see FIG. 8) are omitted from the demodulating apparatus 120.

The switch ASw4 has a movable contact and two fixed contacts "a" and "b". The movable contact of the switch ASw4 connects with either the fixed contact "a" or the fixed contact "b" thereof. The movable contact of the switch ASw4 leads to a second input terminal of a multiplier 116. The fixed contact "a" of the switch ASw4 is connected to the output terminal of a voltage-controlled oscillator 119. The fixed contact "b" of the switch ASw4 is connected to the output terminal of a multiplier 117. Thus, the output terminal of the multiplier 117 is connected to the multiplier 116 via the switch ASw4. The output terminal of an amplifier 123 is directly connected to a first input terminal of the multiplier 117.

The multipliers 116 and 117, a loop filter 118, the oscillator 119, and the switch ASw4 compose a PLL circuit 126 corresponding to the PLL circuit 125 of FIG. 8.

Operation of the demodulating apparatus 120 of FIG. 9 can be changed between an FSK mode and a PSK mode by the switches ASw2 and ASw4. When each of the switches ASw2 and ASw4 assumes a first position where its movable contact connects with its fixed contact "a", operation of the demodulating apparatus 120 falls into the FSK mode. When each of the switches ASw2 and ASw4 assumes a second position where its movable contact connects with its fixed contact "b", operation of the demodulating apparatus 120 falls into the PSK mode. It is preferable that the switches ASw2 and ASw4 are ganged with each other.

During the PSK mode of operation, the structure of the demodulating apparatus 120 of FIG. 9 is the same as the structure of the demodulating apparatus 110 of FIG. 8. Accordingly, the PSK mode of operation of the demodulating apparatus 120 is the same as that of the demodulating apparatus 110.

During the FSK mode of operation, the output signal of the oscillator 119 travels to the multiplier 116 without passing through the multiplier 117. The FSK mode of operation of the demodulating apparatus 120 is substantially the same as that of the demodulating apparatus 110.

Seventh Embodiment

Figure 10:
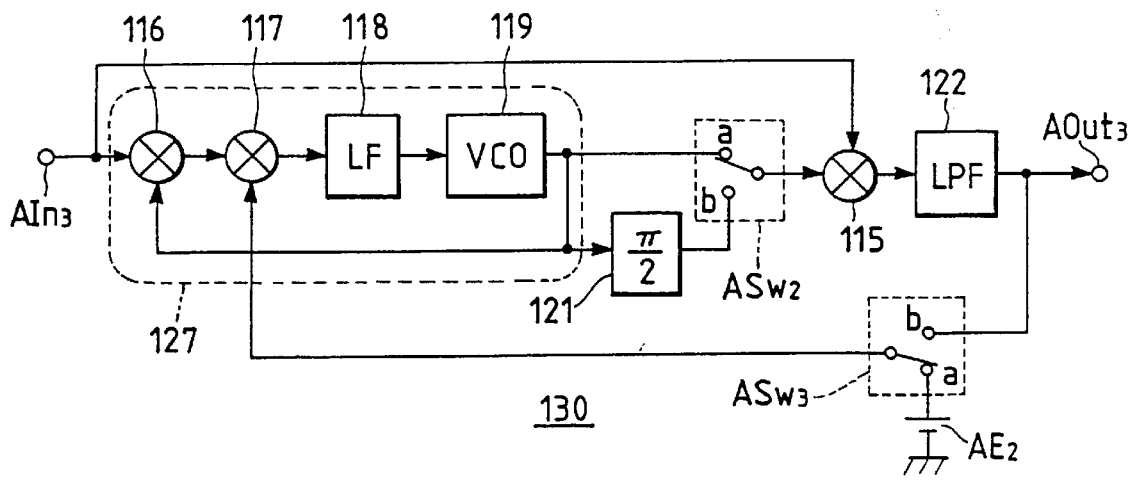
FIG. 10 is a block diagram of a demodulating apparatus according to a seventh embodiment of this invention.

FIG. 10 shows a demodulating apparatus 130 which is similar to the demodulating apparatus 110 of FIG. 8 except for design changes indicated hereinafter. The amplifier 123 (see FIG. 8) is omitted from the demodulating apparatus 130.

In the demodulating apparatus 130 of FIG. 10, the output terminal of a low pass filter 122 is directly connected to a fixed contact "b" of a switch ASw3. A second input terminal of a multiplier 117 is connected to the output terminal of a multiplier 116. The output terminal of the multiplier 117 is connected to the input terminal of a loop filter 118. A second input terminal of the multiplier 116 is directly connected to the output terminal of a voltage-controlled oscillator 119.

The multipliers 116 and 117, the loop filter 118, and the oscillator 119 compose a PLL circuit 127 corresponding to the PLL circuit 125 of FIG. 8.

Operation of the demodulating apparatus 130 of FIG. 10 can be changed between an FSK mode and a PSK mode by a switch ASw2 and the switch ASw3. When each of the switches ASw2 and ASw3 assumes a first position where its movable contact connects with its fixed contact "a", operation of the demodulating apparatus 130 falls into the FSK mode. When each of the switches ASw2 and ASw3 assumes a second position where its movable contact connects with its fixed contact "b", operation of the demodulating apparatus 130 falls into the PSK mode. It is preferable that the switches ASw2 and ASw3 are ganged with each other.

During the PSK mode of operation of the demodulating apparatus 130, an incoming PSK modulation signal Sp(t) is fed to a multiplier 115 and the multiplier 116 via an apparatus input terminal AIn3. The oscillator 119 outputs a reproduced carrier "sin(ωt+φ2)" to the multiplier 116 where "φ2" denotes a phase delay. The device 116 multiplies the incoming PSK modulation signal Sp(t) and the reproduced carrier "sin(ωt+φ2)", and thereby outputs a signal Ep1(t) expressed as follows.

$$Ep1(t)=d(t)\cdot\{\sin(2\omega t+\phi 1+\phi 2)-\sin(\phi 1-\phi 2)\}/2 \qquad (13)$$

where "φ1" denotes a phase delay related to the PSK modulation signal Sp(t). The output signal Ep1(t) of the multiplier 116 is fed to the multiplier 117. The multiplier 117 receives a recovered information signal "d(t)" from the low pass filter 122 via the switch ASw3. The device 117 multiplies the recovered information signal "d(t)" and the output signal Ep1(t) of the multiplier 116, and thereby outputs a signal Ep2(t) expressed as follows.

$$Ep2(t) = \{d(t)^2 \cdot \sin(2\omega t + \phi 1 + \phi 2) - d(t)^2 \cdot \sin(\phi 1 - \phi 2)\}/2 \quad (14)$$
$$= \{\sin(2\omega t + \phi 1 + \phi 2) - \sin(\phi 1 - \phi 2)\}/2$$

It should be noted that the value "d(t)²" is equal to "1". The output signal Ep2(t) of the multiplier 117 is applied to the loop filter 118. High-frequency components are removed from the signal Ep2(t) by the loop filter 118 so that a phase error signal "−sin(φ1−φ2)" appears at the output terminal of the loop filter 118. When the difference between the phase factors "φ1" and "φ2" is small, the value "−sin(φ1−φ2)" is approximated to a value of "−(φ1−φ2)". The phase error signal is fed from the loop filter 118 to the oscillator 119 as a control signal. The oscillator 119 outputs a signal having a frequency which depends on the phase error signal. The output signal of the oscillator 119 agrees with a reproduced carrier having an angular frequency "ω".

During the PSK mode of operation of the demodulating apparatus 130, the reproduced carrier "sin(ωt+φ2)" is fed from the oscillator 119 to the phase shifter 121. The device 121 shifts the phase of the reproduced carrier by 90° C. (π/2 radian), and thereby makes the reproduced carrier into a second carrier expressed as "cos(ωt+φ2)". The second carrier is fed from the phase shifter 121 to the multiplier 115 via the switch ASw2. The multiplier 115 receives the incoming PSK modulation signal Sp(t) via the apparatus input terminal AIn3. The device 115 multiplies the PSK modulation signal and the second carrier, thereby outputting a signal Sd(t) expressed by the previous equation (7). The output signal Sd(t) of the multiplier 115 is applied to the low pass filter 122. High-frequency components are removed from the signal Sd(t) by the low pass filter 122 so that a recovered information signal "d(t)" appears at the output terminal of the low pass filter 122. The recovered information signal "d(t)" is applied to the apparatus output terminal AOut3 from the low pass filter 122. As previously described, the recovered information signal "d(t)" is also fed to the multiplier 117 from the low pass filter 122 via the switch ASw3.

During the FSK mode of operation of the demodulating apparatus 130, a predetermined positive dc voltage (high-level signal with a logic state of "1") is fed to the multiplier 117 from a dc power supply AE2 via the switch ASw3, and hence the multiplier 117 serves as a simple amplifier or a buffer. Therefore, the structure of the demodulating apparatus 130 of FIG. 10 is substantially the same as the structure of the demodulating apparatus 110 of FIG. 8. Thus, the FSK mode of operation of the demodulating apparatus 130 is substantially the same as that of the demodulating apparatus 110.

Eighth Embodiment

Figure 11:
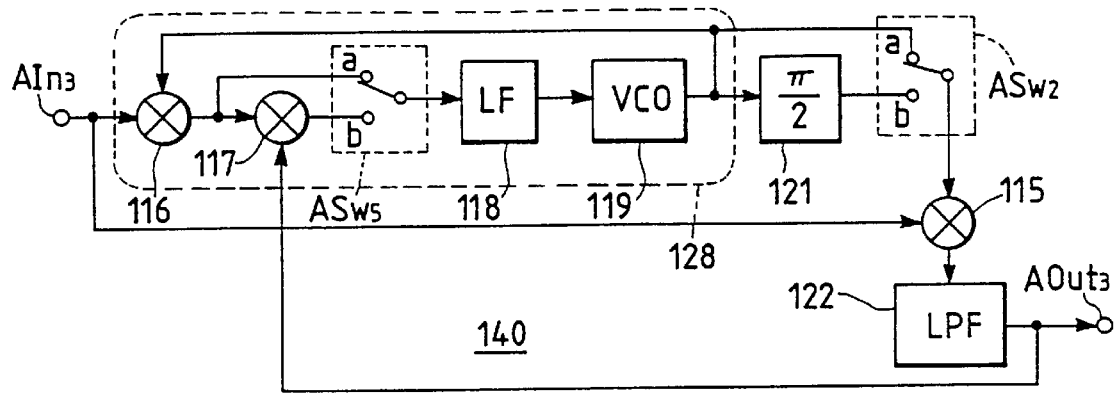
FIG. 11 is a block diagram of a demodulating apparatus according to an eighth embodiment of this invention.

FIG. 11 shows a demodulating apparatus 140 which is similar to the demodulating apparatus 130 of FIG. 10 except for design changes indicated hereinafter. As shown in FIG. 11, the demodulating apparatus 140 includes a switch ASw5. The switch ASw3 (see FIG. 10) and the dc power supply AE2 (see FIG. 10) are omitted from the demodulating apparatus 140.

The switch ASw5 has a movable contact and two fixed contacts "a" and "b". The movable contact of the switch ASw5 connects with either the fixed contact "a" or the fixed contact "b" thereof. The movable contact of the switch ASw5 leads to the input terminal of a loop filter 118. The fixed contact "a" of the switch ASw5 is connected to the output terminal of a multiplier 116. The fixed contact "b" of the switch ASw5 is connected to the output terminal of a multiplier 117. Thus, the output terminal of the multiplier 117 is connected to the loop filter 118 via the switch ASw5. A first input terminal of the multiplier 117 is directly connected to the output terminal of a low pass filter 122.

The multipliers 116 and 117, the loop filter 118, a voltage-controlled oscillator 119, and the switch ASw5 compose a PLL circuit 128 corresponding to the PLL circuit 127 of FIG. 10.

Operation of the demodulating apparatus 140 of FIG. 11 can be changed between an FSK mode and a PSK mode by a switch ASw2 and the switch ASw5. When each of the switches ASw2 and ASw5 assumes a first position where its movable contact connects with its fixed contact "a", operation of the demodulating apparatus 140 falls into the FSK mode. When each of the switches ASw2 and ASw5 assumes a second position where its movable contact connects with its fixed contact "b", operation of the demodulating apparatus 140 falls into the PSK mode. It is preferable that the switches ASw2 and ASw5 are ganged with each other.

During the PSK mode of operation, the structure of the demodulating apparatus 140 of FIG. 11 is the same as the structure of the demodulating apparatus 130 of FIG. 10. Accordingly, the PSK mode of operation of the demodulating apparatus 140 is the same as that of the demodulating apparatus 130.

During the FSK mode of operation of the demodulating apparatus 130, the structure of the demodulating apparatus 140 of FIG. 11 is substantially the same as the structure of the demodulating apparatus 130 of FIG. 10. Accordingly, the FSK mode of operation of the demodulating apparatus 140 is substantially the same as that of the demodulating apparatus 130.

Ninth Embodiment

Figure 12:
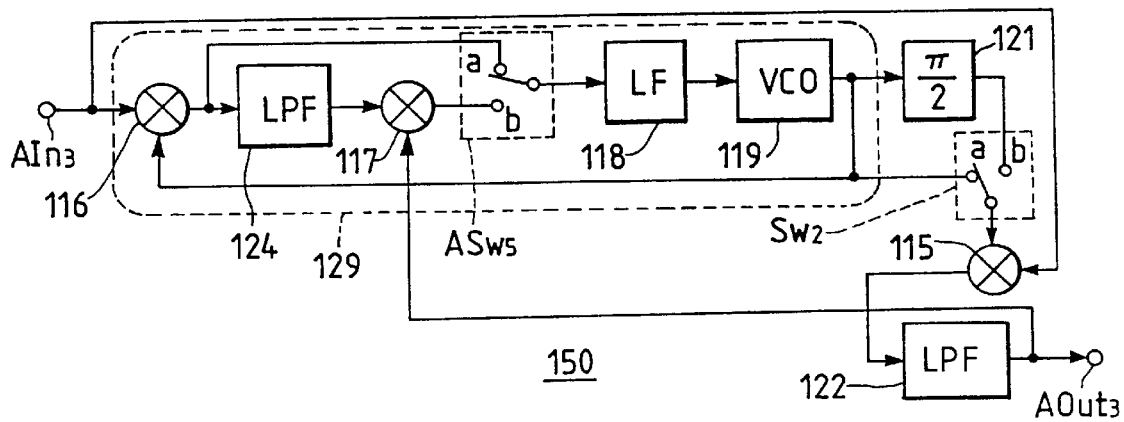
FIG. 12 is a block diagram of a demodulating apparatus according to a ninth embodiment of this invention.

FIG. 12 shows a demodulating apparatus 150 which is similar to the demodulating apparatus 140 of FIG. 11 except that a low pass filter 124 is interposed between multipliers 116 and 117. The transmission characteristic (transfer characteristic) of the low pass filter 124 is equal to that of a low pass filter 122. This design provides an agreement in phase between an information signal component of the output signal of the multiplier 116 and a recovered information signal outputted from the low pass filter 122 during a PSK mode of operation of the demodulating apparatus 150. The phase agreement minimizes the level of components "d(t)²" of the output signal of the multiplier 117, thereby reducing the level of jitter components of a reproduced carrier outputted from a voltage-controlled oscillator 119.

Tenth Embodiment

Figure 13:
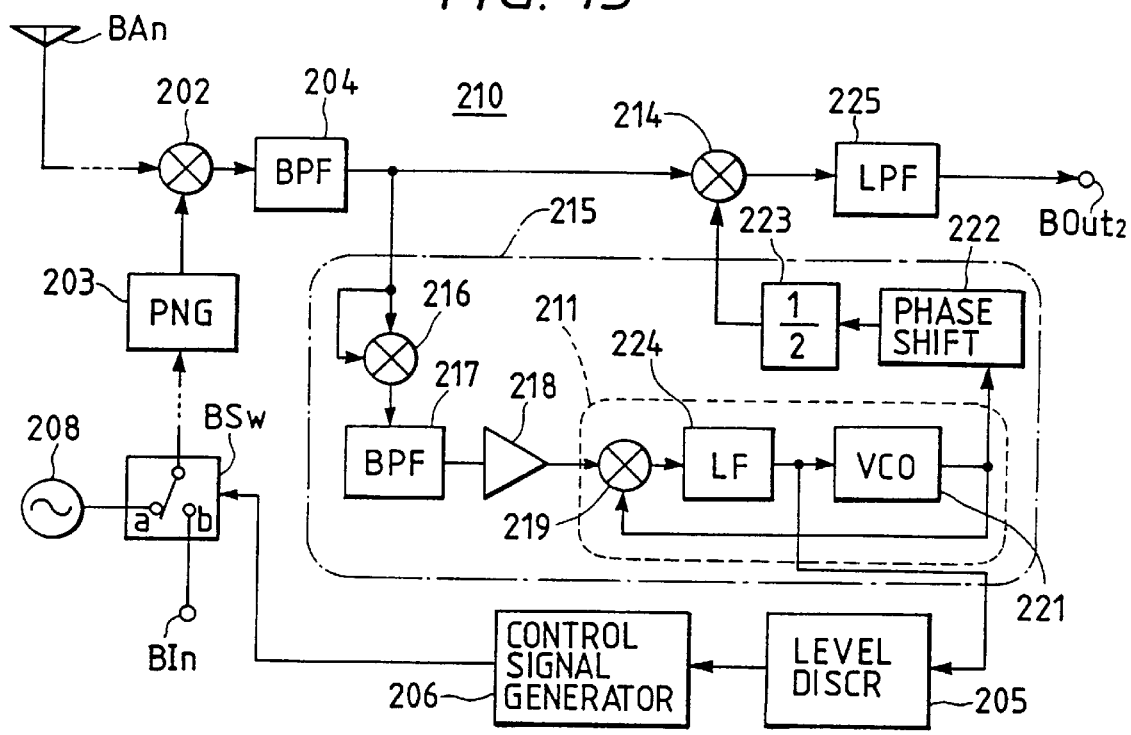
FIG. 13 is a block diagram of a spread spectrum demodulating apparatus according to a tenth embodiment of this invention.

With reference to FIG. 13, a spread spectrum receiver or a spread spectrum demodulating apparatus 210 includes an antenna BAn, a multiplier (mixer) 202, a pseudonoise generator (spread code generator) 203, a band pass filter 204, a level discriminator 205, a control signal generator 206, a switch BSw, an oscillator 208, a multiplier (mixer) 214, a carrier reproducing circuit 215, and a low pass filter 225.

The carrier reproducing circuit 215 includes a multiplier (mixer) 216, a band pass filter 217, a limiter amplifier 218, a multiplier (mixer) 219, a voltage-controlled oscillator 221, a phase shifter 222, and a frequency divider 223, and a loop filter 224. The multiplier 219, the loop filter 224, and the oscillator 221 compose a PLL circuit 211.

The antenna BAn leads to a first input terminal of the multiplier 202. The output terminal of the pseudonoise generator 203 is connected to a second input terminal of the multiplier 202. The output terminal of the multiplier 202 is connected to the input terminal of the band pass filter 204. The output terminal of the band pass filter 204 is connected to a first input terminal of the multiplier 214. The output terminal of the multiplier 214 is connected to the input terminal of the low pass filter 225. The output terminal of the low pass filter 225 leads to an apparatus output terminal BOut2.

The output terminal of the level discriminator 205 is connected to the input terminal of the control signal generator 206. The output terminal of the control signal generator 206 is connected to a control terminal of the switch BSw.

The switch BSw has a movable contact and two fixed contacts "a" and "b". The movable contact of the switch BSw connects with either the fixed contact "a" or the fixed contact "b" thereof. The movable contact of the switch BSw is followed by the clock input terminal of the pseudonoise generator 203. The fixed contact "a" of the switch BSw is connected to the output terminal of the oscillator 208. The fixed contact "b" of the switch BSw is connected to an apparatus input terminal BIn1.

The output terminal of the band pass filter 204 is connected to first and second input terminals of the multiplier 216. The output terminal of the multiplier 216 is connected to a first input terminal of the multiplier 219 via the band pass filter 217 and the limiter amplifier 218. The output terminal of the multiplier 219 is connected to the input terminal of the loop filter 224. The output terminal of the loop filter 224 is connected to the control terminal of the oscillator 221. The output terminal of the loop filter 224 is also connected to the input terminal of the level discriminator 205. The output terminal of the oscillator 221 is connected to the input terminal of the phase shifter 222. The output terminal of the oscillator 221 is also connected to a second input terminal of the multiplier 219. The output terminal of the phase shifter 222 is connected to the input terminal of the frequency divider 223. The output terminal of the frequency divider is connected to a second input terminal of the multiplier 214.

An incoming spread spectrum signal caught by the antenna BAn is fed to the mixer 202 via a band pass filter (not shown). The incoming spread spectrum signal is expressed as "A•P(t)•d(t)•cosωt", where "A" denotes the amplitude; "P(t)" denotes a spread code signal; "d(t)" denotes an information signal; and "cosωt" denotes a carrier. The information signal "d(t)" is of the bi-value type which can be changed between "+1" and "−1". During an initial stage of operation of the demodulating apparatus 210, the movable contact of the switch BSw connects with the fixed contact "a" thereof so that the output signal of the oscillator 208 is fed to the pseudonoise generator 203 via the switch BSw as a clock signal. The oscillator 208 is preferably designed so that its oscillation frequency continuously varies between predetermined upper and lower limits. The pseudonoise generator 203 produces a signal representative of a spread code in response to the clock signal. The spread code signal is fed from the pseudonoise generator 203 to the multiplier 202. The spread code signal is expressed as "P(t−τ)" where "τ" denotes a phase difference or a time offset relative to the spread code signal "P(t)" in the incoming spread spectrum signal.

The multiplier 202 despreads the incoming spread spectrum signal in response to the spread code signal "P(t−τ)", thereby outputting a despread demodulation signal (recovered primary modulation signal) expressed as "A•P(t)•P(t−τ)•d(t)•cosωt". When the phase difference "τ" is null, the despread demodulation signal is expressed as "A•d(t)•cosωt". It should be noted that $P(t)^2=1$. The despread demodulation signal is fed from the multiplier 202 to the first and second input terminals of the multiplier 216 via the band pass filter 204.

The band pass filter 204 is tuned to the frequency of the carrier "cosωt". The output signal of the band pass filter 204 has a waveform such as shown in the part [A] of FIG. 14. In FIG. 14, "(b)" and "(d)" denote correlation points at which a good agreement occurs in spread code signal between a transmitter side and the receiver side (the demodulating apparatus side). At the correlation points "(b)" and "(d)", the output signal of the multiplier 202 is lean in spread spectrum components, and the output signal of the multiplier 202 passes through the band pass filter 204 without receiving a significant loss. In FIG. 14, "(a)", "(c)", and "(e)" denote noncorrelation intervals during which a disagreement occurs in spread code signal between the transmitter side and the receiver side. During the noncorrelation intervals "(a)", "(c)", and "(e)", the output signal of the multiplier 202 is rich in spread spectrum components, and the output signal of the multiplier 202 passes through the band pass filter 204 with receiving a significant loss. Therefore, a large level difference is present between a correlation point and a noncorrelation interval.

As previously described, the despread demodulation signal is fed from the multiplier 202 to the first and second input terminals of the multiplier 216 via the band pass filter 204. The multiplier 216 serves as a frequency doubler which doubles the frequency of the output signal of the band pass filter 204. The output signal of the multiplier 216 is fed to the multiplier 219 via the band pass filter 217 and the limiter amplifier 218. The band pass filter 217 is tuned to twice the frequency of the carrier "cosωt". The output signal of the band pass filter 217 is expressed as "(½)•$A^2$•cos2ωt".

The output signal of the band pass filter 217 is subjected to amplification and amplitude limitation by the limiter amplifier 218. The output signal of the limiter amplifier 218 is fed to the multiplier 219. The output signal of the oscillator 221 is fed to the multiplier 219. The multiplier 219 serves as a phase comparator. The multiplier 219 compares the phase of the output signal of the limiter amplifier 218 and the phase of the output signal of the oscillator 221 to derive an error (phase error) therebetween. The output signal of the multiplier 219 is applied to the loop filter 224 so that high-frequency components of the output signal of the multiplier 219 are removed thereby. Thus, the output signal of the multiplier 219 is processed by the loop filter 224 into a phase comparison signal (phase error signal) having a waveform such as shown in the part [B] of FIG. 14. The phase comparison signal is fed from the loop filter 224 to the oscillator 221 as a control signal so that the frequency of oscillation of the oscillator 221 depends on the phase comparison signal. Thus, the frequency of the output signal of the oscillator 221 follows the frequency of the output signal of the limiter amplifier 218 according to the function of the PLL circuit 211.

As shown in FIG. 14, the level of the phase comparison signal (phase error signal) outputted from the loop filter 224 is, minimized at the correlation points "(b)" and "(d)". The level discriminator 205 receives the output signal of the loop filter 224, and senses the minimization of the level of the phase comparison signal to detect the correlation points "(b)" and "(d)".

A clock signal generator (not shown) reproduces a clock signal in response to, for example, the output signal of the oscillator 221 or the frequency divider 223. The reproduced clock signal is fed to the fixed contact "b" of the switch BSw via the apparatus input terminal BIn1. At the correlation points "(b)" and "(d)", the reproduced clock signal is the same as a clock signal for a pseudonoise signal in the transmitter side.

The PLL circuit 215 serves as an FM demodulator. At the correlation points "(b)" and "(d)" in FIG. 14, the spread component level (spread noise level) is low and the carrier level is high so that a high C/N (carrier-to-noise) ratio occurs. During the noncorrelation intervals "(a)", "(c)", and "(e)" in FIG. 14, the spread component level (spread nose level) is high and the carrier level is small so that a low C/N ratio occurs. It is well-known in the art that the S/N (signal-to-noise) ratio of a recovered signal which results from FM demodulation of a modulation signal is remarkably higher than the C/N ratio of the modulation signal. Since the PLL circuit 215 serves as an FM demodulator, the level discriminator 205 detects a correlation point with adequate accuracy and reliability.

The level discriminator 205 informs the control signal generator 206 of the detection of the correlation point. The control signal generator 206 includes a flip-flop or a combination of a switch and a dc power source which generates a binary signal. The binary signal changes in logic state when the control signal generator 206 is informed of the detection of the correlation point. The control signal generator 206 outputs the binary signal to the switch BSw as a switch change signal. When the binary signal changes in logic state as previously described, the movable contact of the switch BSw connects with the fixed contact "b" thereof so that the reproduced clock signal same as the transmitter-side clock signal starts to be fed to the pseudonoise generator 203 via the switch BSw as a clock signal. Accordingly, the pseudonoise generator 203 starts to produce the spread code signal in response to the correct clock signal. In this way, there occurs the establishment of a good synchronization (agreement) in spread code signal between the transmitter and the receiver 210. During a later time, the synchronization (agreement) in spread code signal remains maintained.

The level of the output signal of the band pass filter 204 depends on the intensity of the incoming spread code signal. The limiter amplifier 218 serves to hold essentially constant the level of the signal inputted into the PLL circuit 211 independent of a level change in the output signal of the band pass filter 204. This design ensures that the spread noise level of the phase error signal outputted by the loop filter 224 remains substantially independent of a variation in the intensity of the incoming spread code signal. Accordingly, the level discriminator 205 is enabled to accurately detect a correlation point.

The phase shifter 222 receives the output signal of the oscillator 221. After the establishment of the synchronization (agreement) in spread code signal between the transmitter and the receiver 210, the phase of the output signal of the oscillator 221 differs from the phase of the signal inputted into the carrier reproducing circuit 215 (the output signal of the band pass filter 204) by $\pi/2$. The phase shifter 222 compensates for this phase difference. The frequency divider 223 receives the output signal of the phase shifter 222 and halves the frequency of the output signal of the phase shifter 222, thereby reproducing a carrier "$\cos\omega t$". The reproduced carrier is applied from the frequency divider 223 to the multiplier 214. The multiplier 214 compares the phase of the output signal (recovered primary modulation signal) of the band pass filter 204 and the phase of the reproduced carrier, thereby demodulating the primary modulation signal into an original information signal "d(t)" with unnecessary high-frequency components. The output signal of the multiplier 214 is fed to the low pass filter 225 so that the unnecessary high-frequency components thereof are removed by the low pass filter 225. Thus, the low pass filter 225 recovers the original information signal "d(t)". The recovered original information signal "d(t)" is applied from the low pass filter 225 to the apparatus output terminal BOut2. It should be noted that the low pass filter 225 may be omitted.

Eleventh Embodiment

Figure 15:
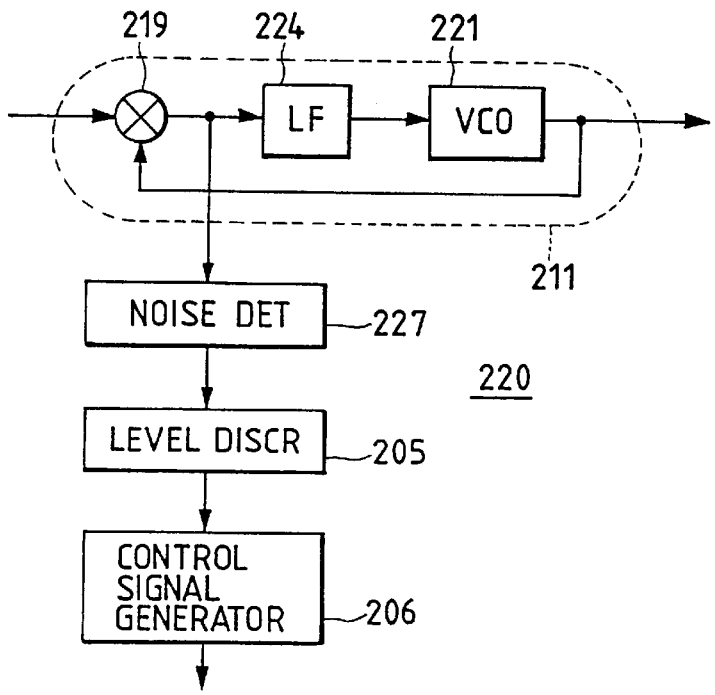
FIG. 15 is a block diagram of a portion of a spread spectrum demodulating apparatus according to an eleventh embodiment of this invention.

FIG. 15 shows a spread signal demodulating apparatus 220 which is similar to the demodulating apparatus 210 of FIG. 13 except that a noise detector 227 is additionally provided connected to the output terminal of a multiplier 219. The level discriminator 205 is not connected to the output of low pass filter 224, as in FIG. 13, but is connected to the output terminal of the noise detector 227. The circuits connected to control signal generator 206, the output of VCO 221, and the input to the multiplier 219 are the same as in FIG. 13.

The noise detector 227 includes a low pass filter and a sensing section. The low pass filter in the noise detector 227 removes input-signal components having frequencies higher than a carrier frequency "$\omega$". The sensing section in the noise detector 227 detects the level of the output signal of the low pass filter therein. The level discriminator 205 responds to the output signal of the sensing section in the noise detector 227.

Since the noise detector 227 responds to the signal which appears at the output side of the multiplier 219 but the input side of the loop filter 224, a correlation point can be detected even when a PLL circuit 211 moves out of locked conditions.

Twelfth Embodiment

Figure 16:
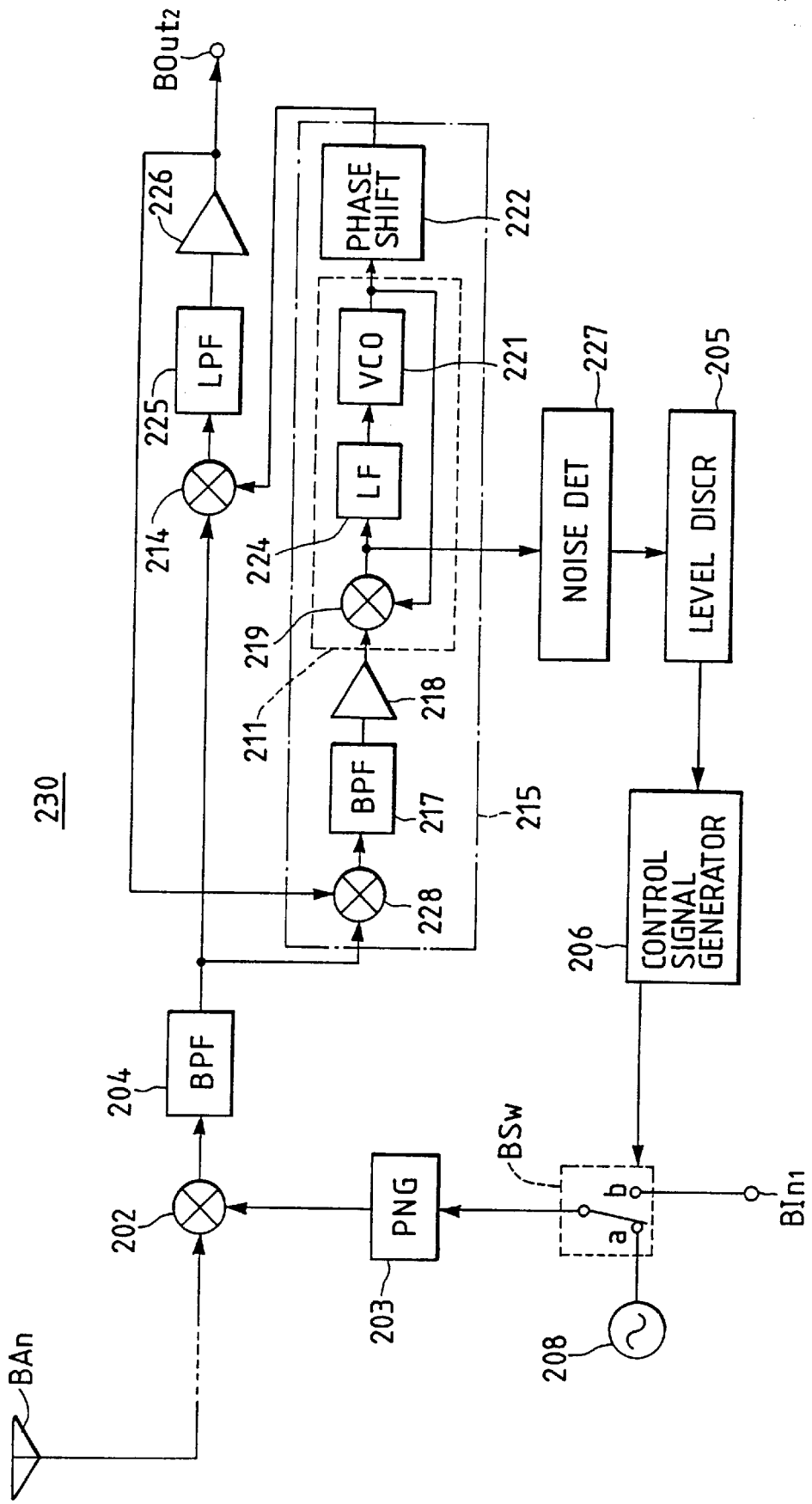
FIG. 16 is a block diagram of a spread spectrum demodulating apparatus according to a twelfth embodiment of this invention.

With reference to FIG. 16, a spread spectrum receiver or a spread spectrum demodulating apparatus 230 includes an antenna BAn, a multiplier (mixer) 202, a pseudonoise generator (spread code generator) 203, a band pass filter 204, a level discriminator 205, a control signal generator 206, a switch BSw, an oscillator 208, a multiplier (mixer) 214, a carrier reproducing circuit 215, a low pass filter 225, an amplifier 226, and a noise detector 227.

The carrier reproducing circuit 215 includes a band pass filter 217, a limiter amplifier 218, a multiplier (mixer) 219, a voltage-controlled oscillator 221, a phase shifter 222, a loop filter 224, and a multiplier (mixer) 228. The multiplier 219, the loop filter 224, and the oscillator 221 compose a PLL circuit 211.

The antenna BAn leads to a first input terminal of the multiplier 202. The output terminal of the pseudonoise generator 203 is connected to a second input terminal of the multiplier 202. The output terminal of the multiplier 202 is connected to the input terminal of the band pass filter 204. The output terminal of the band pass filter 204 is connected to a first input terminal of the multiplier 214 and also a first input terminal of the multiplier 228. The output terminal of the multiplier 214 is connected to the input terminal of the low pass filter 225. The output terminal of the low pass filter 225 is connected to the input terminal of the amplifier 226. The output terminal of the amplifier 226 leads to an apparatus output terminal BOut2. The output terminal of the amplifier 226 is also connected to a second input terminal of the multiplier 228.

The output terminal of the noise detector 227 is connected to the input terminal of the level discriminator 205. The output terminal of the level discriminator 205 is connected to the input terminal of the control signal generator 206. The output terminal of the control signal generator 206 is connected to a control terminal of the switch BSw.

The switch BSw has a movable contact and two fixed contacts "a" and "b". The movable contact of the switch BSw connects with either the fixed contact "a" or the fixed contact "b" thereof. The movable contact of the switch BSw is followed by the clock input terminal of the pseudonoise generator 203. The fixed contact "a" of the switch BSw is connected to the output terminal of the oscillator 208. The fixed contact "b" of the switch BSw is connected to an apparatus input terminal BIn1.

The output terminal of the multiplier 228 is connected to a first input terminal of the multiplier 219 via the band pass filter 217 and the limiter amplifier 218. The output terminal of the multiplier 219 is connected to the input terminal of the loop filter 224 and also the input terminal of the noise detector 227. The output terminal of the loop filter 224 is connected to the control terminal of the oscillator 221. The output terminal of the oscillator 221 is connected to the input terminal of the phase shifter 222. The output terminal of the oscillator 221 is also connected to a second input terminal of the multiplier 219. The output terminal of the phase shifter 222 is connected to a second input terminal of the multiplier 214.

An incoming spread spectrum signal caught by the antenna BAn is fed to the mixer 202 via a band pass filter (not shown). The incoming spread spectrum signal is expressed as "A1•P(t)•d(t)•cosωt", where "A1" denotes the amplitude; "P(t)" denotes a spread code signal; "d(t)" denotes an information signal; and "cosωt" denotes a carrier. The information signal "d(t)" is of the bi-value type which can be changed between "+1" and "−1". During an initial stage of operation of the demodulating apparatus 230, the movable contact of the switch BSw connects with the fixed contact "a" thereof so that the output signal of the oscillator 208 is fed to the pseudonoise generator 203 via the switch BSw as a clock signal. The oscillator 208 is preferably designed so that its oscillation frequency continuously varies between predetermined upper and lower limits. The pseudonoise generator 203 produces a signal representative of a spread code in response to the clock signal. The spread code signal is fed from the pseudonoise generator 203 to the multiplier 202. The spread code signal is expressed as "P(t−τ)" where "τ" denotes a phase difference or a time offset relative to the spread code signal "P(t)" in the incoming spread spectrum signal.

The multiplier 202 despreads the incoming spread spectrum signal in response to the spread code signal "P(t−τ)", thereby outputting a despread demodulation signal (recovered primary modulation signal) expressed as "A1•P(t)•P(t−τ)•d(t)•cosωt". When the phase difference "τ" is null, the despread demodulation signal is expressed as "A1•d(t)•cosωt". It should be noted that $P(t)^2=1$. The despread demodulation signal is fed from the multiplier 202 to the multipliers 214 and 228 via the band pass filter 204.

The band pass filter 204 is tuned to the frequency of the carrier "cosωt". The output signal of the band pass filter 204 has a waveform such as shown in the part [A] of FIG. 14. At correlation points "(b)" and "(d)" in FIG. 14, a recovered information signal "d(t)" is fed to the multiplier 228 via the amplifier 226. The device 228 multiplies the despread demodulation signal "A1•d(t)•cosωt" and the recovered information signal "d(t)", thereby outputting a signal expressed as "A1•cosωt" if signal delays caused by devices including the low pass filter 225 are not taken into consideration. It should be noted that $d(t)^2=1$. The output signal of the multiplier 228 is fed to the band pass filter 217, and is processed thereby. The band pass filter 217 is tuned to the frequency of the carrier "cosωt" so that a reproduced carrier "A1•cosωt" appears at the output terminal of the band pass filter 217. The reproduced carrier is fed from the band pass filter 217 to the multiplier 219 in the PLL circuit 211 via the limiter amplifier 218. The limiter amplifier 218 serves to limit the amplitude of the reproduced carrier. The PLL circuit 211 serves as a narrow-band tracking filter so that a good reproduced carrier essentially free from jitter components appears at the output terminal of the oscillator 221.

During noncorrelation intervals "(a)", "(c)", and "(e)", the signal inputted into the PLL circuit 211 is rich in spread spectrum components, which cause jitter components of a reproduced carrier appearing at the output terminal of the oscillator 221. The multiplier 219 compares the phase of the output signal of the oscillator 221 and the output signal of the limiter amplifier 218, thereby outputting a phase error signal with a waveform such as shown in the part [B] of FIG. 14. There is a large difference in spread noise level of the phase error signal between a correlation point and a noncorrelation point. Specifically, the spread noise level at the correlation point is remarkably smaller than the spread noise level during the noncorrelation interval. Thus, the spread noise level decreases when the noncorrelation interval is replaced by the correlation point.

The noise detector 227 senses spread noise components of the output signal (phase error signal) of the multiplier 219, and outputs a signal with a level depending on the level of the sensed spread noise components. The level discriminator 205 receives the output signal of the noise detector 227, and senses a decrease in the spread noise level of the phase comparison signal to detect a correlation point.

A clock signal generator (not shown) reproduces a clock signal in response to, for example, the output signal of the oscillator 221 or the phase shifter 222. The reproduced clock signal is fed to the fixed contact "b" of the switch BSw via the apparatus input terminal BIn1. At the correlation points "(b)" and "(d)" in FIG. 14, the reproduced clock signal is the same as a clock signal for a pseudonoise signal in the transmitter side.

The level discriminator 205 informs the control signal generator 206 of the detection of the correlation point. The control signal generator 206 includes a flip-flop or a combination of a switch and a dc power source which generates a binary signal. The binary signal changes in logic state when the control signal generator 206 is informed of the detection of the correlation point. The control signal generator 206 outputs the binary signal to the switch BSw as a switch change signal. When the binary signal changes in logic state as previously described, the movable contact of the switch BSw connects with the fixed contact "b" thereof so that the reproduced clock signal same as the transmitter-side clock signal starts to be fed to the pseudonoise generator 203 via the switch BSw as a clock signal. Accordingly, the pseudonoise generator 203 starts to produce the spread code signal in response to the correct clock signal. In this way, there occurs the establishment of a good synchronization (agreement) in spread code signal between the transmitter and the receiver 230. During a later time, the synchronization (agreement) in spread code signal remains maintained.

The level of the output signal of the band pass filter 204 depends on the intensity of the incoming spread code signal.

The limiter amplifier 218 serves to hold essentially constant the level of the signal inputted into the PLL circuit 211 independent of a level change in the output signal of the band pass filter 204. This design ensures that the spread noise level of the phase error signal outputted by the loop filter 224 remains substantially independent of a variation in the intensity of the incoming spread code signal. The limiter amplifier 218 serves as an AGC circuit which enables a dynamic range of about 130 dB.

The phase shifter 222 receives the output signal of the oscillator 221. After the establishment of the synchronization (agreement) in spread code signal between the transmitter and the receiver 230, the phase of the output signal of the oscillator 221 differs from the phase of the signal inputted into the carrier reproducing circuit 215 (the output signal of the band pass filter 204) by $\pi/2$. The phase shifter 222 compensates for this phase difference, thereby reproducing a carrier "A2•cos$\omega$t" where "A2" denotes the amplitude. The reproduced carrier is applied from the phase shifter 222 to the multiplier 214. The multiplier 214 executes synchronous demodulation. The device 214 multiplies the output signal (recovered primary modulation signal) "A1•d(t)•cos$\omega$t" of the band pass filter 204 and the reproduced carrier "A2•cos$\omega$t", thereby outputting a signal expressed as "$(A1 \cdot A2/2) \cdot d(t) \cdot (1+cos2\omega t)$".

The output signal of the multiplier 214 is fed to the low pass filter 225. High-frequency components of the output signal of the multiplier 214 are removed by the low pass filter 225 so that a recovered information signal expressed as "(A1•A2/2)•d(t)" appears at the output terminal of the low pass filter 225. The recovered information signal is fed from the low pass filter 225 to the amplifier 226. The amplifier 226 serves as a waveshaper or a voltage comparator which converts the recovered information signal into a second recovered information signal expressed as "A3•d(t)", where "A3" denotes the amplitude which is substantially independent of the amplitude A1 of the incoming spread spectrum signal. The second recovered information signal is applied from the amplifier 226 to the apparatus output terminal BOut2. As previously described, the second recovered information signal is also fed from the amplifier 226 to the multiplier 228.

Thirteenth Embodiment

Figure 17:
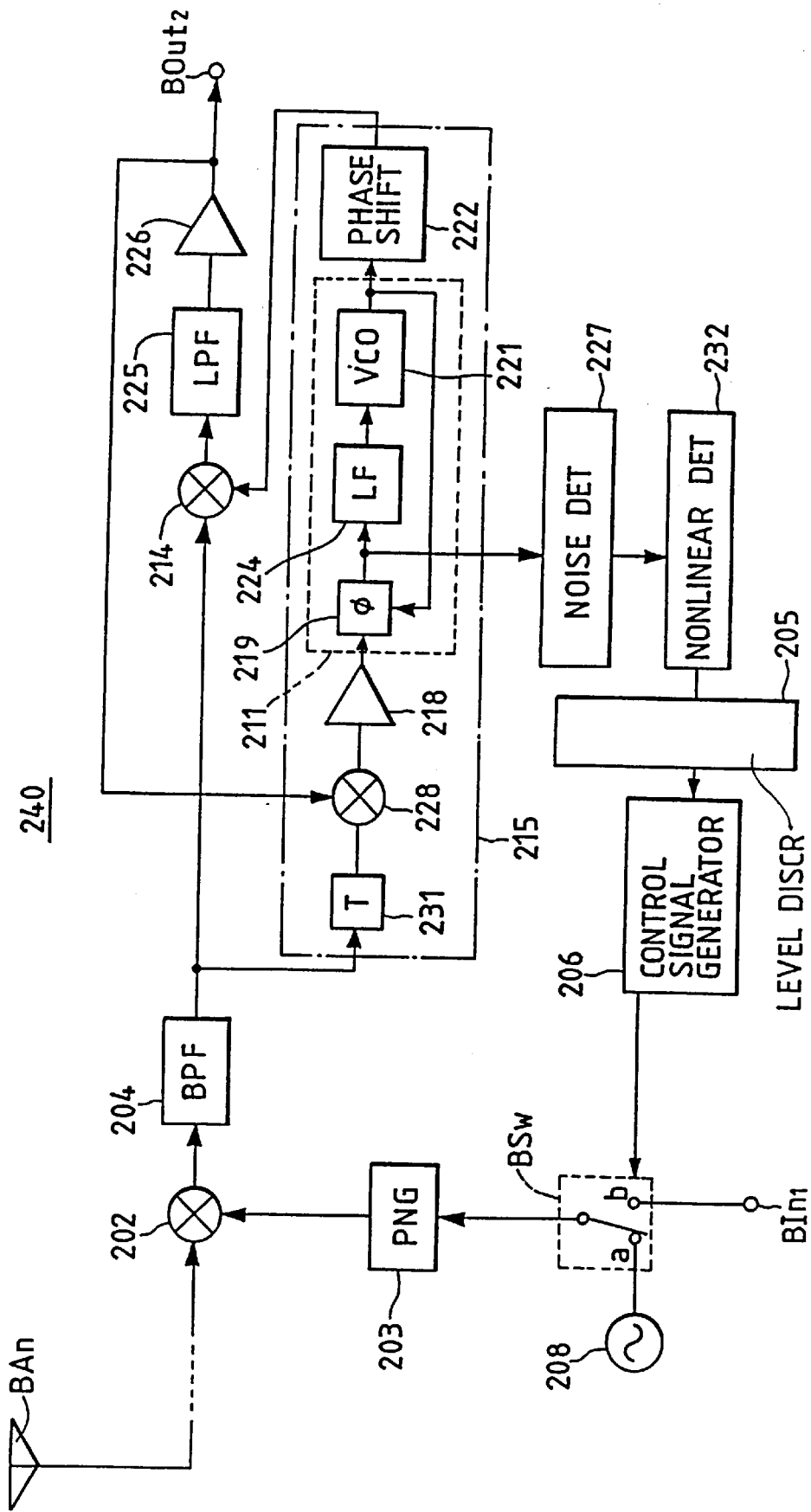
FIG. 17 is a block diagram of a spread spectrum demodulating apparatus according to a thirteenth embodiment of this invention.

FIG. 17 shows a spread spectrum demodulating apparatus (spread spectrum receiver) 240 which is similar to the demodulating apparatus 230 of FIG. 16 except that a delay circuit 231 and a nonlinear detector 232 are additionally provided. As shown in FIG. 17, the delay circuit 231 is interposed between a band pass filter 204 and a multiplier 228. The nonlinear detector 232 is interposed between a noise detector 227 and a level discriminator 205.

A recovered information signal fed to the multiplier 228 from an amplifier 226 has a phase delay (time delay) "T" relative to the output signal of the band pass filter 204 which is caused by devices including a low pass filter 25. The recovered information signal fed to the multiplier 228 is thus expressed as "d(t−T)". The delay circuit 231 delays the output signal of the band pass filter 204 by a predetermined time equal to the delay time "T", thereby compensating for the phase difference between the two signals inputted into the multiplier 228. The delay circuit 231 outputs the delay-resultant signal to the multiplier 228.

The nonlinear detector 232 is designed to enable the level discriminator 205 to discriminate between a correlation point and a noncorrelation interval with increased accuracy and reliability.

The output signal of the band pass filter 204 has a waveform such as shown in the part [A] of FIG. 18. When the waveform of the output signal of the band pass filter 204 agrees with the waveform of the part [A] of FIG. 18, the output signal of the noise detector 227 has a waveform such as shown in the part [B] of FIG. 18. In FIG. 18, "(b)" and "(d)" denote correlation points at which the spread noise level of the output signal of the noise detector 227 is minimized. In FIG. 18, "(a)", "(c)", and "(e)" denote non-correlation intervals during which the spread noise level of the output signal of the noise detector 227 is relatively high.

The part [A] of FIG. 19 shows a waveform of the output signal of the band pass filter 204 which occurs under poor receiving conditions. When the waveform of the output signal of the band pass filter 204 agrees with the waveform of the part [A] of FIG. 19, the output signal of the noise detector 227 has a waveform such as shown in the part [B] of FIG. 19. In this case, the output signal of the nonlinear detector 232 has a waveform such as shown in the part [C] of FIG. 19. In FIG. 19, "(b)" and "(d)" denote correlation points at which the spread noise level of the output signal of the noise detector 227 is minimized. In FIG. 19, "(a)", "(c)", and "(e)" denote noncorrelation intervals during which the spread noise level of the output signal of the noise detector 227 is relatively high.

A multiplier 202 receives an incoming spread spectrum signal "A1•P(t)•d(t)•cos$\omega$t" from an antenna BAn. Also, the multiplier 202 receives a spread code signal "P(t−$\tau$)" from a pseudonoise generator (spread code generator) 203. The multiplier 202 despreads the incoming spread spectrum signal in response to the spread code signal, thereby outputting a despread demodulation signal (recovered primary modulation signal) expressed as "$A1 \cdot P(t) \cdot P(t-\tau) \cdot d(t) \cdot cos\omega t$".

The despread demodulation signal is fed from the multiplier 202 to a multiplier 214 and a carrier reproducing circuit 215 via the band pass filter 204.

At correlation points "(b)" and "(d)" in FIGS. 18 and 19 where the phase difference "$\tau$" is null, the despread demodulation signal is expressed as "A1•d(t)•cos$\omega$t". It should be noted that $P(t)^2=1$. The delay circuit 231 delays the despread demodulation signal, and thereby outputs a delay-resultant signal expressed as "$A1 \cdot d(t-T) \cdot cos(\omega t - \omega T)$".

The multiplier 228 receives the output signal of the delay circuit 231. The multiplier 228 receives a recovered information signal "d(t−T)" from an amplifier 226. The device 228 multiplies the delay-resultant despread demodulation signal "A1•d(t−T)•cos($\omega$t−$\omega$T)" and the recovered information signal "d(t−T)", thereby outputting a signal expressed as "A1•cos($\omega$t−$\omega$T)". It should be noted that $d(t-T)^2=1$.

During noncorrelation intervals "(a)", "(c)" and "(e)" in FIGS. 18 and 19, a voltage-controlled oscillator 221 outputs a carrier rich in jitter components. A phase error signal outputted from a phase comparator 219 is fed to the noise detector 227. The noise detector 227 senses spread noise components of the phase error signal, and outputs a signal having a waveform such as shown in the part [B] of each of FIGS. 18 and 19. The output signal of the noise detector 227 is fed to the nonlinear detector 232. As shown in the part [C] of FIG. 19, the nonlinear detector 232 expands or enlarges a spread noise level variation (difference) in the output signal of the noise detector 227. The level discriminator 205 receives the output signal of the nonlinear detector 232, and discriminates the spread noise level of the received signal to detect a correlation point.

The level discriminator 205 informs a control signal generator 206 of the detection of the correlation point. The control signal generator 206 changes a switch BSw in response to the detection of the correlation point so that a reproduced clock signal same as a transmitter-side clock signal starts to be fed from a clock signal generator (not shown) to a pseudonoise generator 203 via the switch BSw as a clock signal. Accordingly, the pseudonoise generator 203 starts to produce the spread code signal in response to the correct clock signal. In this way, there occurs the establishment of a good synchronization (agreement) in spread code signal between the transmitter and the receiver 240. During a later time, the synchronization (agreement) in spread code signal remains maintained.

A phase shifter 222 receives the output signal of the oscillator 221. After the establishment of the synchronization (agreement) in spread code signal between the transmitter and the receiver 240, the phase of the output signal "A2•cos($\omega$t−$\omega$T−$\theta$)" of the oscillator 221 differs from the phase of the carrier "A1•cos$\omega$t" in the signal inputted into the carrier reproducing circuit 215 (the output signal of the band pass filter 204). The phase shifter 222 compensates for this phase difference, thereby reproducing a carrier "A2•cos$\omega$t" where "A2" denotes the amplitude. It should be noted that "$\theta$" denotes the phase of a carrier fed to the phase comparator 219 during basic operation of a PLL circuit 211. The reproduced carrier is applied from the phase shifter 222 to a multiplier 214. The multiplier 214 executes synchronous demodulation. The device 214 multiplies the output signal (primary modulation signal) "A1•d(t)•cos$\omega$t" of the band pass filter 204 and the reproduced carrier "A2•cos$\omega$t", thereby outputting a signal expressed as "(A1•A2/2)•d(t)• (1+cos2$\omega$t)". The output signal of the multiplier 214 is fed to the low pass filter 225. Carrier components of the output signal of the multiplier 214 are removed by the low pass filter 225. The output signal of the low pass filter 225 is applied to the amplifier 226, and is subjected to waveshaping thereby. The amplifier 226 outputs a recovered information signal "d(t−T)" which has been affected by the phase delay "T". The recovered information signal is applied from the amplifier 226 to an apparatus output terminal BOut2.

Figure 20:
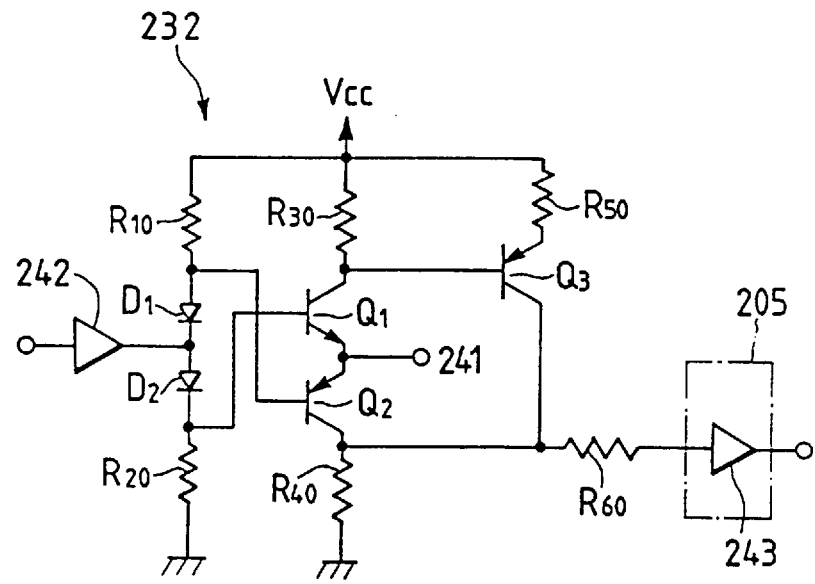
FIG. 20 is a diagram of a nonlinear detector in the spread spectrum demodulating apparatus of FIG. 17.

As shown in FIG. 20, the nonlinear detector 231 includes resistors R10, R20, R30, R40, R50, and R60, diodes D1 and D2, transistors 91, 92, and Q3, and an amplifier 242. A series combination of the resistor R10, the diode D1, the diode D2, and the resistor R20 is connected between a power supply line and the ground. The power supply line is subjected to a predetermined positive voltage Vcc. The input terminal of the amplifier 242 is connected to the output terminal of the noise detector 227 (see FIG. 17). The output terminal of the amplifier 242 is connected to the junction between the diodes D1 and D2. A series combination of the resistor R30, the collector-emitter path of the transistor Q1, the emitter-collector path of the transistor Q2, and the resistor R40 is connected to the power supply line and the ground. The base of the transistor Q1 is connected to the junction between the diode D2 and the resistor R20. The base of the transistor Q2 is connected to the junction between the resistor R10 and the diode D1. The emitter of the transistor Q3 is connected to the power supply line via the resistor R50. The base of the transistor Q3 is connected to the junction between the resistor R30 and the transistor Q1. The collector of the transistor Q3 is connected to the junction between the transistor Q2 and the resistor R40. The collector of the transistor Q3 is connected to an input amplifier 243 of the level discriminator 205 via the resistor R60. The junction between the transistors Q1 and Q2 leads to a terminal 241 subjected to a predetermined positive voltage having a level of Vcc/2.

The amplifier 242 is subjected to a dc voltage having a level of Vcc/2. The resistances of the resistors R10 and R20 have a relation as "R10=R20". The diodes D1 and D2 are equal in characteristics. The resistances of the resistors R30 and R40 have a relation as "R30=R40". The transistors 91 and Q2 are complementary with each other. The resistances of the resistors R40, R50, and R60 are set in a relation as "R50=R40//R60 (parallel connection)" to equalize signal levels applied to the amplifier 243 within the level discriminator 205 which correspond to a positive-polarity signal and a negative-polarity signal exceeding threshold levels +SHL and −SHL (see FIG. 21) respectively. This design enables the positive-polarity signal level and the negative-polarity signal level to balance with each other. The amplifier 243 within the level discriminator 205 has a predetermined small input resistance.

Each of the transistors Q1 and Q2 serves as a switch changeable between an on state (conductive state) and an off state (nonconductive state). Specifically, the transistor Q1 assumes the on state when the base voltage of the transistor Q1 increases above the voltage Vcc/2 by higher than a positive threshold level +SHL equal to the sum of the base-emitter voltage of the transistor Q1 and the normal-direction voltage of the diode D2. Otherwise, the transistor Q1 assumes the off state. On the other hand, the transistor Q2 assumes the on state when the base voltage of the transistor Q2 decreases below the voltage Vcc/2 by higher than a negative threshold level −SHL equal to the sum of the base-emitter voltage of the transistor Q2 and the normal-direction voltage of the diode D2. Otherwise, the transistor Q2 assumes the off state. The transistors Q1 and Q3 compose a phase inverter. When the transistor Q1 changes to the on state, the collector voltage of the transistor Q1 drops from the level Vcc to the level Vcc/2 so that the transistor Q3 generates a collector output voltage equal to a level of Vcc/2. When the transistor Q2 changes to the on state, the transistor Q2 generates a collector output voltage equal to a level of Vcc/2.

Figure 21A:
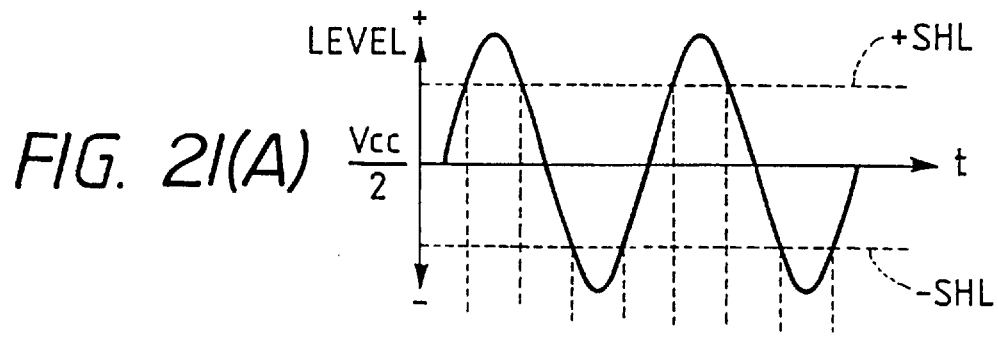
FIGS. 21(A)–21(B), hereinafter collectively referred to as "FIG. 21", are a time-domain diagram of the waveforms of signals in the nonlinear detector of FIG. 20.
Figure 21B:
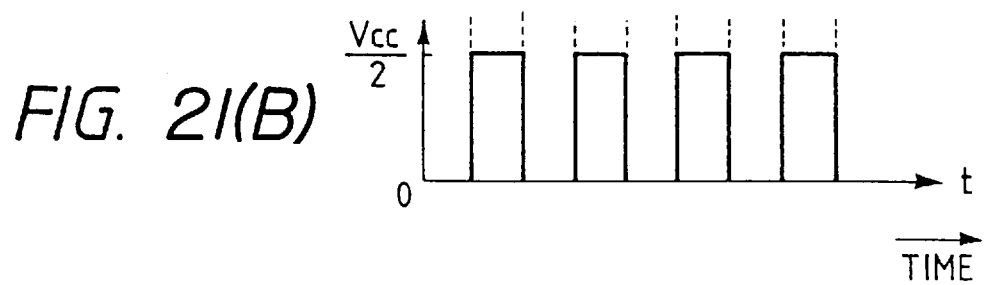

It is now assumed that the output signal of the amplifier 242 has a waveform shown in the part [A] of FIG. 21. In this case, the output signal of the nonlinear detector 232 which appears at the junction among the transistors Q2 and Q3 and the resistor R60 has a waveform shown in the part [B] of FIG. 21. When the output signal of the amplifier 242 is higher than the positive threshold level +SHL or lower than the negative threshold level −SHL, a major portion of the nonlinear detector 232 is in a conductive state so that the voltage Vcc/2 is transmitted as an output signal of the nonlinear detector 232. When the output signal of the amplifier 242 is present between the positive threshold level +SHL and the negative threshold level −SHL, the output signal of the nonlinear detector 232 has a level of 0 volt. As shown in the parts [A] and [B] of FIG. 21, the output signal of the amplifier 242 is shaped into equal-height pulses while the output signal of the nonlinear detector 232 which has a level smaller than the level Vcc/2 is folded back or inverted. Thus, the output signal of the nonlinear detector 232 agrees with a signal resulting from substantially full-wave detection.

The output signal of the nonlinear detector 232 is fed to the level discriminator 205, being converted into a bi-level signal (binary signal) thereby. The bi-level signal is outputted from the nonlinear detector 232 to a control signal generator 206 (see FIG. 17). As previously described, the control signal generator 206 generates a switch control signal in response to the bi-level signal, and outputs the switch control signal to the switch BSw. When a noncorrelation interval is replaced by a correlation point, the switch BSw is changed by the switch control signal so that a clock signal is fed to the pseudonoise generator 203 via the apparatus input terminal ln1 and the switch BSw.

Fourteenth Embodiment

Figure 22:
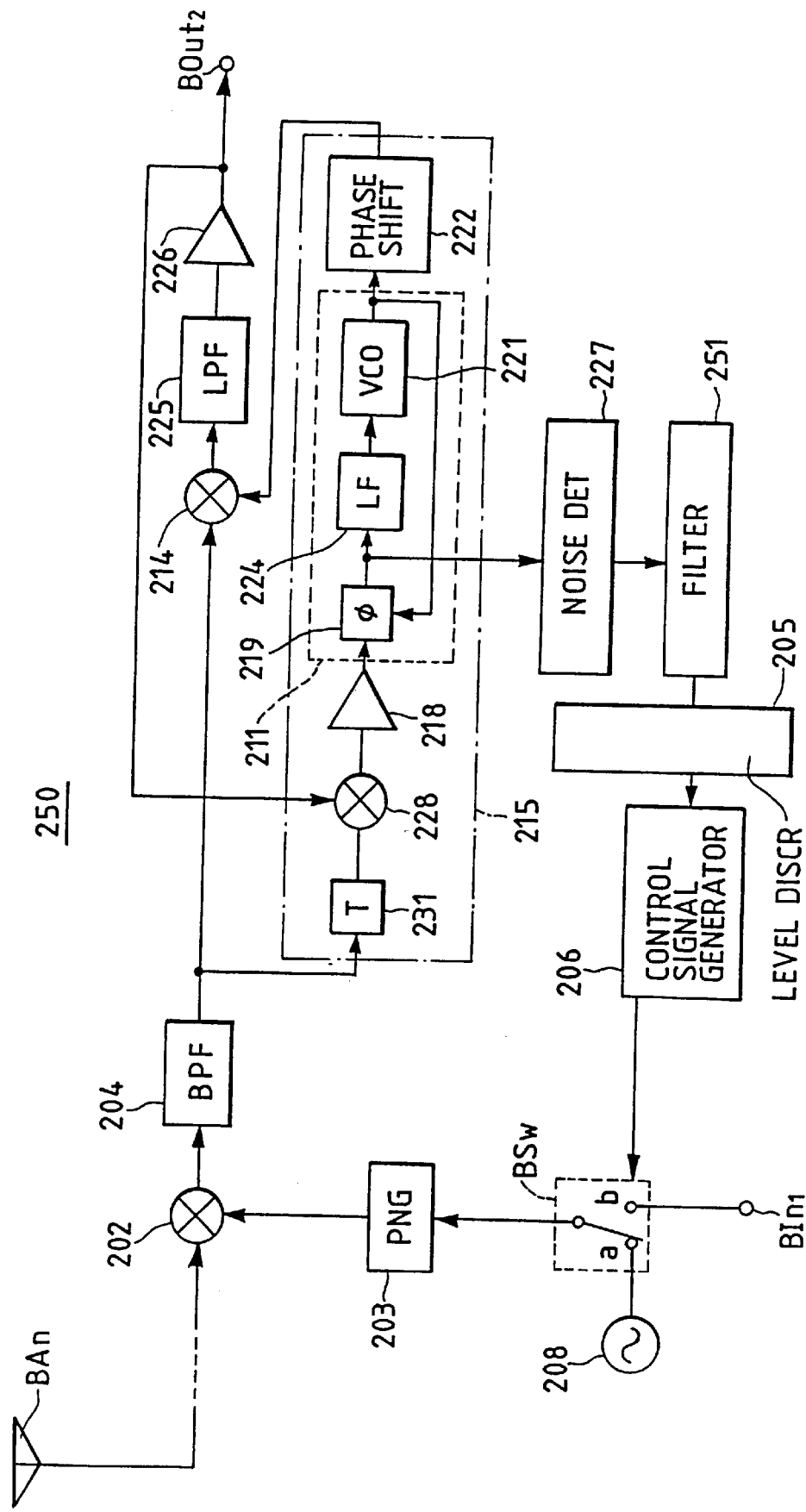
FIG. 22 is a block diagram of a spread spectrum demodulating apparatus according to a fourteenth embodiment of this invention.
Figure 23A:
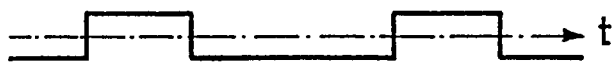
FIGS. 23(A)–23(D), hereinafter collectively referred to as "FIG. 23", are a time-domain diagram of the waveforms of signals in the spread spectrum demodulating apparatus of FIG. 22.
Figure 23B:
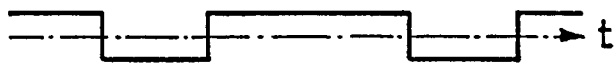
Figure 23C:
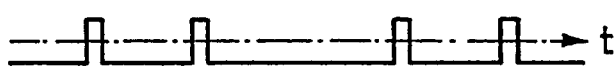
Figure 23D:
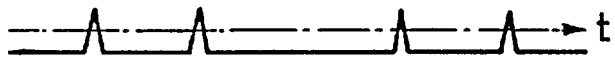

FIG. 22 shows a spread spectrum demodulating apparatus (spread spectrum receiver) 250 which is similar to the demodulating apparatus 240 of FIG. 17 except that the nonlinear detector 232 (see FIG. 17) is replaced by a filter 251.

A multiplier 202 receives an incoming spread spectrum signal "A1•P(t)•d(t)•cos(ωt−θ0)" from an antenna BAn, where "θ0" denotes an initial phase of the carrier. Also, the multiplier 202 receives a spread code signal "P(t−τ)" from a pseudonoise generator (spread code generator) 203. The multiplier 202 despreads the incoming spread spectrum signal in response to the spread code signal, thereby outputting a despread demodulation signal ( recovered primary modulation signal) expressed as "A1•P(t)•P(t−τ)•d(t)•cos(ωt−θ0)".

The despread demodulation signal is fed from the multiplier 202 to a multiplier 214 and a carrier reproducing circuit 215 via a band pass filter 204.

At correlation points "(b)" and "(d)" in FIGS. 18 and 19 where the phase difference "τ" is null, the despread demodulation signal is expressed as "A1•d(t)•cos(ωt−θ0)".

It should be noted that P(t)²=1. The delay circuit 231 delays the despread demodulation signal, and thereby outputs a delay-resultant signal expressed as "A1•d(t−T2)•cos(ωt−ωT2−θ0)"

where "T2" denotes a delay time provided by the delay circuit 231. The multiplier 228 receives the output signal of the delay circuit 231. The multiplier 228 receives a recovered information signal "−d(t−T1)" from an amplifier 226, where "T1" denotes a delay time caused by devices including a low pass filter 225. The delay time T2 provided by the delay circuit 231 is set equal to the delay time T1. The device 228 multiplies the delay-resultant despread demodulation signal "A1•d(t−T2)•cos(ωt−ωT2−θ0)"

and the recovered information signal "−d(t−T1)", thereby outputting a signal expressed as "−A1•cos(ωt−ωT1−θ0)".

It should be noted that d(t−T1)²=1 and T1=T2.

During noncorrelation intervals "(a)", "(c)", and "(e)" in FIGS. 18 and 19, a voltage-controlled oscillator 221 outputs a carrier rich in jitter components. A phase error signal outputted from a phase comparator 219 is fed to the noise detector 227. The noise detector 227 senses spread noise components of the phase error signal, and outputs a signal representing the sensed spread noise components. The output signal of the nose detector 227 is fed to the filter 251. As the rate (frequency) of the information signal increases, a difference between the delay times T1 and T2 would more adversely affect level discrimination executed by a level discriminator 205. The filter 251 is designed to remove such an adverse affection.

The information signal "d(t−T2)" in the output signal of the delay circuit 231 has a waveform such as shown in the part [A] of FIG. 23. In the case where the delay time T1 slightly differs from the delay time T2, the information signal "−d(t−T1)" outputted from the amplifier 226 has a waveform such as shown in the part [B] of FIG. 23. When the waveforms of the information signals "d(t−T2)" and "−d(t−T1)" agree with those in the parts [A] and [B] of FIG. 23, the output signal "d(t−T2)•−d(t−T1)" of the multiplier 228 has a waveform shown in the part [C] of FIG. 23. In this case, the waveform of the output signal of the multiplier 228 is similar to that of a signal which results from differentiation of the information signal "d(t−T2)" in the output signal of the delay circuit 231. When the waveform of the output signal of the multiplier 228 corresponds to the waveform in the part [C] of FIG. 23, the output signal of the noise detector 227 has a waveform shown in the part [D] of FIG. 23.

Figure 24:
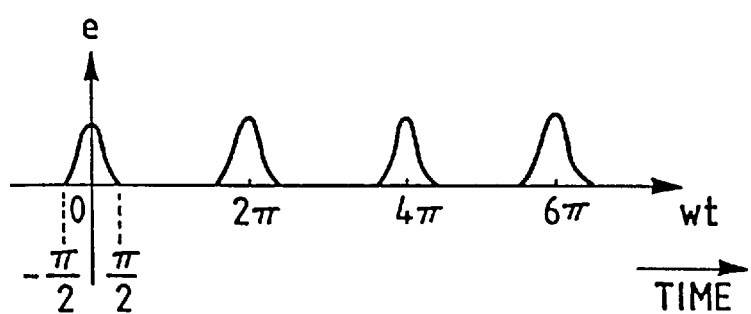
FIG. 24 is a time-domain diagram of the waveform of a signal in the spread spectrum demodulating apparatus of FIG. 22.

As shown in the part [D] of FIG. 23, the output signal of the noise detector 227 contains noise components which have a differentiation-resultant waveform and which are basically unrelated to spread spectrum. As shown in FIG. 24, in the case where the differentiation-resultant components are continuous, the differentiation-noise-related output signal of the noise detector 227 can be approximated to (cosωt)² when time "ωt" is between "−πT/2" and "π/2". In addition, the differentiation-noise-related output signal of the noise detector 227 can be approximated to a waveform of zero voltage when time "ωt" is between "π/2" and "3π/2". The differentiation-noise-related output signal "e(t)" of the noise detector 227 is expressed by the following expansion.

$$e(t) = \frac{1}{4} + \frac{4}{\pi} \left[ \frac{1}{3} \cos\omega t + \frac{1}{15} \cos3\omega t - \frac{1}{105} \cos5\omega t + \ldots \right.$$
$$\left. + \frac{(-1)^n}{(2n-1)\{(2n-1)^2-4\}} \cos(2n-1)\omega t + \ldots \right] \quad (15)$$

Figure 25:
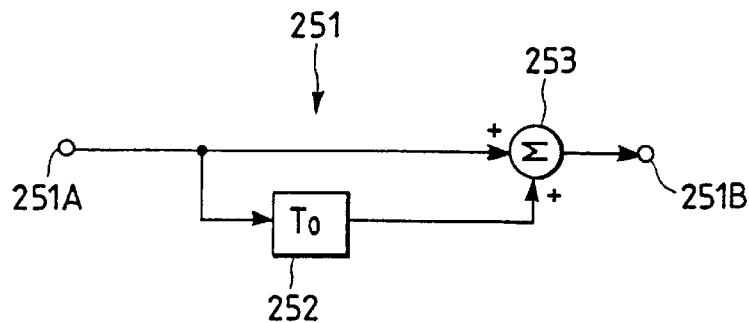
FIG. 25 is a block diagram of a filter in the spread spectrum demodulating apparatus of FIG. 22.

The filter 251 is of the comb type. As shown in FIG. 25, the filter 251 includes a delay circuit 252 and an adder 253. The input terminal 251A of the filter 251 follows the output terminal of the noise detector 227 (see FIG. 22). The input terminal 251A is connected to the input terminal of the delay circuit 252. The input terminal 251A is also connected to a first input terminal of the adder 253. The output terminal of the delay circuit 252 is connected to a second input terminal of the adder 253. The output terminal of the adder 253 leads to the output terminal of the filter 251B which is connected to the level discriminator 205.

An input signal transmitted via the input terminal 251A is fed to the delay circuit 252 and the adder 253. The device 252 delays the input signal by a predetermined time To. The output signal of the delay circuit 252 is fed to the adder 253. The device 253 adds the input signal and the output signal of the delay circuit 252. The output signal of the adder 253 is applied to the output terminal 251B.

It is well-known in the art that the transfer function H(ω) of such a comb filter is expressed as follows.

$$|H(\omega)|=2|\cos(\omega To/2)| \quad (16)$$

Figure 26:
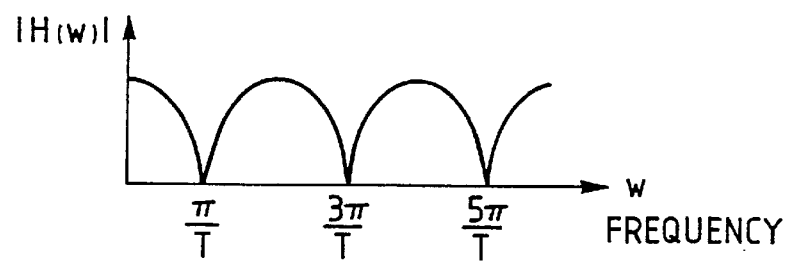
FIG. 26 is a diagram of the characteristic of the filter in FIG. 25.
Figure 27:
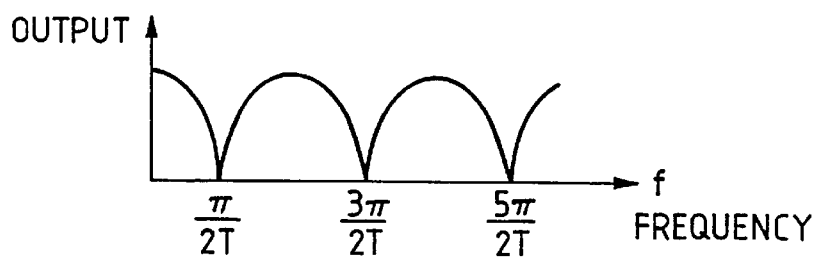
FIG. 27 is a diagram of the frequency response characteristic of the filter in FIG. 25.
Figure 28:
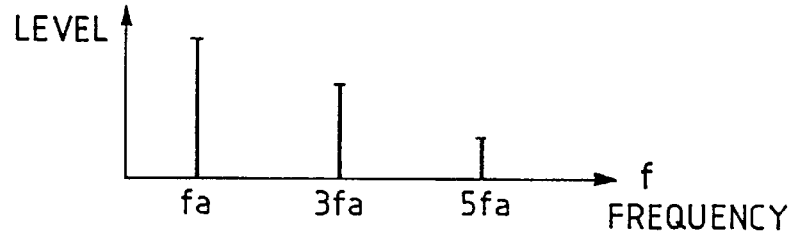
FIG. 28 is a diagram of the spectrum of a signal in the differentiation-noise-related output signal "e(t)" of the spread spectrum demodulating apparatus of FIG. 22.

Accordingly, the filter 251 has a response characteristic shown in FIG. 26. Regarding the filter 251, null points are located at angular frequencies π/To, 3π/To, 5π/To, as shown in FIG. 26. The frequency response characteristic of the filter 251 is shown in FIG. 27. FIG. 28 diagrammatically shows the spectrum of the differentiation-noise-related output signal "e(t)" of the noise detector 227. In FIG. 28, "fo" denotes the fundamental frequency of the signal "e(t)". The delay time To provided by the delay circuit 252 is chosen so that the fundamental frequency "fa" corresponds to the null-point angular frequency "π/To". Accordingly, the filter 251 effectively damps differentiation noise components of the output signal of the noise detector 227 while efficiently passing spread noise components thereof.

Figure 29A:
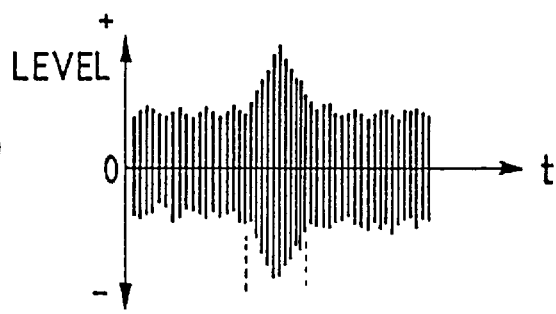
FIGS. 29(A)–29(C), hereinafter collectively referred to as "FIG. 29", are a time-domain diagram of the waveforms of signals in the spread spectrum demodulating apparatus of FIG. 22.
Figure 29B:
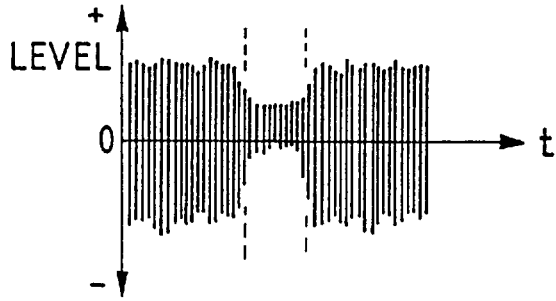
Figure 29C:
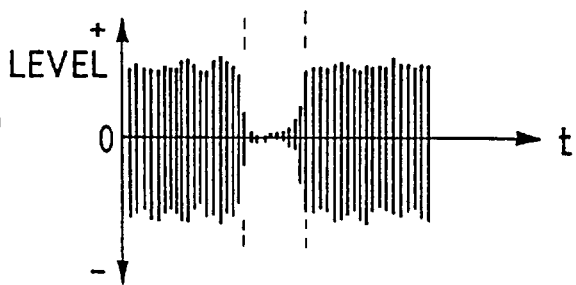

It is now assumed that the output signal of the band pass filter 204 has a waveform shown in the part [A] of FIG. 29 where "(a)" and "(c)" denote noncorrelation intervals and "(b)" denotes a correlation point. In this case, the output signal of the noise detector 227 has a waveform shown in the part [B] of FIG. 29. At the correlation point "(b)", the output signal of the noise detector 227 tends to be contaminated by the previously-described differentiation noise. The filter 251 removes the differentiation noise from the output signal of the noise detector 227, and thereby makes the output signal of the noise detector 227 into a differentiation-noise-free signal having a waveform shown in the part [C] of FIG. 29. The differentiation-noise-free signal exhibits a clearer level difference between the correlation point "(b)" and the non-correlation intervals "(a)" and "(c)". The filter 251 outputs the differentiation-noise-free signal to the level discriminator 205. The differentiation noise removal by the filter 251 enables the level discriminator 205 to more accurately and reliably detect the correlation point "(b)". It should be noted that the comb filter 251 may be replaced by a notch filter.

The output signal "−A1•cos(ωt−ωT1−θ0)" of the multiplier 228 is fed to the phase comparator 219 via a limiter amplifier 218. The oscillator 221 outputs a signal (carrier) "A2•sin(ωt−ωT1−θ1)" to the phase comparator 219, where "θ1" denotes the phase of the carrier fed to the phase comparator 219 which occurs during basic operation of a PLL circuit 211. The device 219 executes phase comparison between the two fed signals, and outputs a resultant phase error signal to a loop filter 224. The loop filter 224 removes high-frequency components from the phase error signal, and thereby converts the phase error signal into a second phase error signal expressed as "E•sin(θ0−θ1)". When the PLL circuit 211 is in a locked state so that the difference between the phases "θ0" and "θ1" is small, the value "E•sin(θ0−θ1)" is approximated to a value of "E•(θ0−θ1)". The second phase error signal is fed from the loop filter 224 to the oscillator 221 as a control signal. The oscillator 221 outputs a signal having a frequency which depends on the second phase error signal. The output signal of the oscillator 221 agrees with a reproduced carrier expressed as "A2•sin(ωt−ωT1−θ1)".

A phase shifter 222 receives the output signal of the oscillator 221. After the establishment of the synchronization (agreement) in spread code signal between a transmitter and the receiver 250, the phase of the output signal "A2•sin(ωt−ωT1−θ1)" of the oscillator 221 differs from the phase of the carrier in the signal inputted into a carrier reproducing circuit 215 (the output signal of the band pass filter 204). The phase shifter 222 compensates for this phase difference, thereby reproducing a carrier "A2•cos(ωt−ωT1−θ0)" provided that the phase factors "θ0" and "θ1" are equal. The reproduced carrier is applied from the phase shifter 222 to a multiplier 214. The multiplier 214 executes synchronous demodulation. The device 214 multiplies the output signal (primary modulation signal) of the band pass filter 204 and the reproduced carrier, thereby outputting a signal expressed as "−(A1•A2/2)•d(t)•{1+cos2(ωt−ωT1−θ1)}".

Thus, the multiplier 214 executes synchronous detection. The output signal of the multiplier 214 is fed to a low pass filter 225. Carrier components of the output signal of the multiplier 214 are removed by the low pass filter 225 so that a signal "−(A1•A2/2)•d(t−T1)" appears at the output terminal of the low pass filter 225. The output signal of the low pass filter 225 is applied to the amplifier 226, and is subjected to waveshaping thereby. The amplifier 226 outputs a recovered information signal "−d(t−T1)". The recovered information signal is applied from the amplifier 226 to an apparatus output terminal BOut2.

Fifteenth Embodiment

Figure 30:
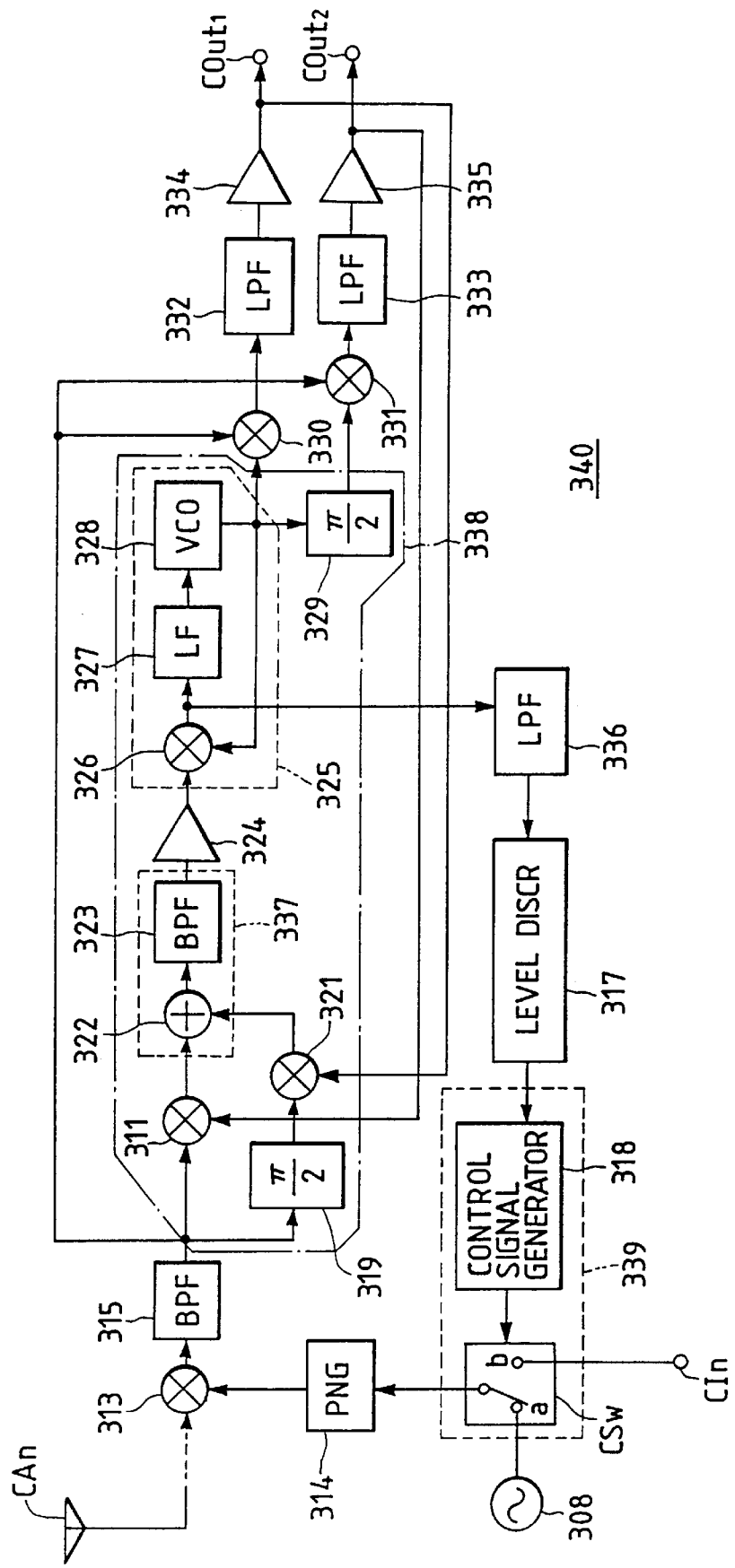
FIG. 30 is a block diagram of a spread spectrum demodulating apparatus according to a fifteenth embodiment of this invention.

With reference to FIG. 30, a spread spectrum receiver or a spread spectrum demodulating apparatus 340 includes an antenna CAn, a multiplier (mixer) 313, a pseudonoise generator (spread code generator) 314, a band pass filter 315, a level discriminator 317, a control signal generator 318, a switch CSw, an oscillator 308, multipliers (mixers) 330 and 331, low pass filters 332 and 334, voltage comparators or amplifiers 334 and 335, a low pass filter 336, and a carrier reproducing circuit 338.

The carrier reproducing circuit 338 includes a multiplier (mixer) 311, a phase shifter 319, a multiplier (mixer) 321, a limiter amplifier 324, a PLL circuit 325, a carrier detector 337, and a phase shifter 329. The carrier detector 337 includes an adder 322 and a band pass filter 323. The PLL circuit 325 includes a multiplier (mixer) 326, a loop filter 327, and a voltage-controlled oscillator 328.

The antenna CAn leads to a first input terminal of the multiplier 313. The output terminal of the pseudonoise generator 314 is connected to a second input terminal of the multiplier 313. The output terminal of the multiplier 313 is connected to the input terminal of the band pass filter 315. The output terminal of the band pass filter 315 is connected to first input terminals of the multipliers 311. 330, and 331. The output terminal of the band pass filter 315 is also connected to the input terminal of the phase shifter 319. The output terminal of the phase shifter 319 is connected to a first input terminal of the multiplier 321.

The output terminal of the multiplier 311 is connected to a first input terminal of the adder 322. The output terminal of the multiplier 321 is connected to a second input terminal of the adder 322. The output terminal of the multiplier 322 is connected to a first input terminal of the multiplier 326 via the band pass filter 323 and the limiter amplifier 324. The output terminal of the multiplier 326 is connected to the control terminal of the oscillator 328 via the loop filter 327. The output terminal of the oscillator 328 is connected to second input terminals of the multipliers 326 and 330. The output terminal of the oscillator 328 is also connected to the input terminal of the phase shifter 329. The output terminal of the phase shifter 329 is connected to a second input terminal of the multiplier 331.

The output terminal of the multiplier 330 is connected to an apparatus output terminal COut1 via the low pass filter 332 and the voltage comparator 334. The output terminal of the multiplier 331 is connected to an apparatus output terminal COut2 via the low pass filter 333 and the voltage comparator 335.

The output terminal of the multiplier 326 is connected to the input terminal of the level discriminator 317 via the low pass filter 336. The output terminal of the level discriminator 317 is connected to the input terminal of the control signal generator 318. The output terminal of the control signal generator 318 is connected to a control terminal of the switch CSw.

The switch CSw has a movable contact and two fixed contacts "a" and "b". The movable contact of the switch CSw connects with either the fixed contact "a" or the fixed contact "b" thereof. The movable contact of the switch CSw is followed by the clock input terminal of the pseudonoise generator 314. The fixed contact "a" of the switch CSw is connected to the output terminal of the oscillator 308. The fixed contact "b" of the switch CSw is connected to an apparatus input terminal CIn.

An incoming spread spectrum signal caught by the antenna CAn is fed to the mixer 313 via a band pass filter (not shown). The incoming spread spectrum signal contains QPSK (quadrature phase shift keying) information. The incoming spread spectrum signal is expressed as "A1•P(t)•{d1(t)•cos(ωt+θ)+d2(t)•sin(ωt+θ)}", where "A1" denotes the amplitude; "P(t)" denotes a spread code signal; "d1(t)" and "d2(t)" denote I (in-phase) and Q (quadrature) information signals respectively; "cos(ωt+θ)" and "sin(ωt+θ)" denote carriers; and "θ" denotes an initial phase of the carriers. Each of the information signals "d1(t)" and "d2(t)" is of the bi-value type which can be changed between "+1" and "−1". During an initial stage of operation of the demodulating apparatus 340, the movable contact of the switch CSw connects with the fixed contact "a" thereof so that the output signal of the oscillator 308 is fed to the pseudonoise generator 314 via the switch CSw as a clock signal. The oscillator 308 is preferably designed so that its oscillation frequency continuously varies between predetermined upper and lower limits. The pseudonoise generator 314 produces a signal representative of a spread code in response to the clock signal. The spread code signal is fed from the pseudonoise generator 314 to the multiplier 313. The spread code signal is expressed as "P(t−τ)" where "τ" denotes a phase difference or a time offset relative to the spread code signal "P(t)" in the incoming spread spectrum signal.

The multiplier 313 despreads the incoming spread spectrum signal in response to the spread code signal "P(t−τ)", thereby outputting a despread demodulation signal (recovered primary modulation signal) expressed as "A1•P(t)•P(t−τ)•{d1(t)•cos(ωt+θ)+d2 (t)•sin(ωt+θ)}".

When the phase difference "τ" is null, the despread demodulation signal is expressed as "A1•{d1(t)•cos(ωt+θ)+d2(t)•sin (ωt+θ)}". It should be noted that P(t)²=1. The despread demodulation signal is fed from the multiplier 313 to the multipliers 311, 330, and 331, and the phase shifter 319 via the band pass filter 315. The band pass filter 315 is tuned to the frequency of the carriers "cos(ωt+θ)" and "sin(ωt+θ)".

A recovered information signal "d2(t)" is fed to the multiplier 311 from the voltage comparator 335. The device 311 multiplies the despread demodulation signal and the recovered information signal, thereby outputting a signal expressed as "A1•{d1(t)•d2(t)•cos(ωt+θ)+sin(ωt+θ) }".

It should be noted that d2(t)²=1.

The device 319 shifts the phase of the despread demodulation signal by 90 degrees (π/2 radian), and thus outputs a second despread demodulation signal expressed as "A1•{d1(t)•sin(ωt+θ)−d2(t)•cos(ωt+θ) }".

The second despread demodulation signal is applied from the phase shifter 319 to the multiplier 321. A recovered information signal "d1(t)" is fed to the multiplier 321 from the voltage comparator 334. The device 321 multiplies the second despread demodulation signal and the recovered information signal, thereby outputting a signal expressed as "A1•{sin(ωt+θ)−d1(t)•d2(t)•cos(ωt+θ)}". It should be noted that d1(t)²=1.

The adder 322 receives the output signals of the multipliers 311 and 321. The device 322 adds the output signals of the multipliers 311 and 321, thereby outputting a signal expressed as "A1•sin(ωt+θ)". Here, it is assumed that an addition loss of the adder 322 corresponds to a factor of ½. The output signal of the adder 322 is fed to the multiplier 326 within the PLL circuit 325 via the band pass filter 323 and the limiter amplifier 324. The band pass filter 323 is tuned to the carrier frequency "ω". The limiter amplifier 324 compensates for a variation in the intensity of the incoming spread spectrum signal.

In the PLL circuit 325, the multiplier 326 receives the output signal of the oscillator 328. The multiplier 326 serves as a phase comparator. The multiplier 326 compares the phase of the output signal of the limiter amplifier 324 and the phase the output signal of the oscillator 328, thereby generating a phase error signal (phase comparison signal) representing the result of the phase comparison. The phase error signal is fed from the multiplier 326 to the control terminal of the oscillator 328 via the loop filter 327 so that the frequency of oscillation of the oscillator 328 depends on the phase error signal. The PLL circuit 325 serves as a narrow-band tracking filter so that a good reproduced carrier essentially free from jitter components appears at the output terminal of the oscillator 328. In the case where the phase comparator 326 uses an analog multiplier, the reproduced carrier outputted from the oscillator 328 is expressed as "A2•cos(ωt+θ0)" where "A2" and "θ0" denote the amplitude and the phase respectively.

The low pass filter 336 receives the output signal of the multiplier 326. The low pass filter 336 removes carrier components from the output signal of the multiplier 326. The output signal of the band pass filter 315 has a waveform such as shown in the part [A] of FIG. 14. When the waveform of the output signal of the band pass filter 315 agrees with the waveform in the part [A] of FIG. 14, the output signal of the low pass filter 336 has a waveform shown in the part [B] of FIG. 14. In FIG. 14, "(b)" and "(d)" denote correlation points at which a good agreement occurs in spread code signal between a transmitter side and the receiver side (the demodulating apparatus side). At the correlation points "(b)" and "(d)", the output signal of the low pass filter 336 has a very small level of spread noise components. In FIG. 14, "(a)", "(c)", and "(e)" denote noncorrelation intervals during which a disagreement occurs in spread code signal between the transmitter side and the receiver side. During the noncorrelation intervals "(a)", "(c)", and "(e)", the output signal of the low pass filter 336 has a high level of spread noise components. Therefore, the output signal of the low pass filter 336 exhibits a large level difference between a correlation point and a noncorrelation interval.

The level discriminator 317 receives the output signal of the low pass filter 336, and senses the level (spread noise level) of the output signal of the low pass filter 336 to discriminate a correlation point from noncorrelation intervals. In other words, the level discriminator 317 serves to detect the correlation point.

A clock signal generator (not shown) reproduces a clock signal in response to, for example, the output signal of the oscillator 328 or the phase shifter 329. The reproduced clock signal is fed to the fixed contact "b" of the switch CSw via the apparatus input terminal CIn. At the correlation points "(b)" and "(d)" in FIG. 14, the reproduced clock signal is the same as a clock signal for a pseudonoise signal in the transmitter side.

The level discriminator 317 informs the control signal generator 318 of the detection of the correlation point. The control signal generator 318 includes a flip-flop or a combination of a switch and a dc power source which generates a binary signal. The binary signal changes in logic state when the control signal generator 318 is informed of the detection of the correlation point. The control signal generator 318 outputs the binary signal to the switch CSw as a switch change signal. When the binary signal changes in logic state as previously described, the movable contact of the switch CSw connects with the fixed contact "b" thereof so that the reproduced clock signal same as the transmitter-side clock signal starts to be fed to the pseudonoise generator 314 via the switch CSw as a clock signal. Accordingly, the pseudonoise generator 314 starts to produce the spread code signal in response to the correct clock signal. In this way, there occurs the establishment of a good synchronization (agreement) in spread code signal between the transmitter and the receiver 340. During a later time, the synchronization (agreement) in spread code signal remains maintained.

As understood from the previous description, the control signal generator 318 and the switch CSw compose a device 339 for capturing the synchronization in spread code signal between the transmitter side and the receiver side.

As previously described, the multiplier 330 receives the output signal of the band pass filter 315. The multiplier 330 receives the reproduced carrier from the oscillator 328. The multiplier 330 executes synchronous demodulation. The device 330 multiplies the output signal (recovered primary modulation signal) of the band pass filter 315 and the reproduced carrier.

When $\theta=\theta0$, the output signal of the multiplier 330 is expressed as $$\text{``}(A1 \cdot A2/2) \cdot [d1(t) \cdot \{1+\cos(2\omega t+\theta+\theta0)\}+d2(t) \cdot \sin(2\omega t+\theta+\theta0)]\text{''}.$$

The phase shifter 329 receives the reproduced carrier from the oscillator 328. The device 329 shifts the phase of the reproduced carrier by 90 degrees ($\pi/2$ radian), thereby converting the reproduced carrier into a second reproduced carrier. The multiplier 331 receives the second reproduced carrier from the phase shifter 329. As previously described, the multiplier 331 receives the output signal of the band pass filter 315. The multiplier 331 executes synchronous demodulation. The device 331 multiplies the output signal (recovered primary modulation signal) of the band pass filter 315 and the second reproduced carrier. When $\theta=\theta0$, the output signal of the multiplier 331 is expressed as $$\text{``}(A1 \cdot A2/2) \cdot [d1(t) \cdot \sin(2\omega t+\theta+\theta0) +d2(t) \cdot \{1-\cos(2\omega t+\theta+\theta0)\}]\text{''}.$$

The output signal of the multiplier 330 is fed to the low pass filter 332. High-frequency components (carrier components) of the output signal of the multiplier 330 are removed by the low pass filter 332 so that a signal expressed as "$(A1 \cdot A2/2) \cdot d1(t)$" appears at the output terminal of the low pass filter 332. The output signal of the low pass filter 332 is fed to the voltage comparator 334. The voltage comparator 334 serves as a waveshaper which converts the output signal of the low pass filter 332 into a recovered information signal expressed as "d1(t)". The recovered information signal "d1(t)" is applied from the voltage comparator 334 to the apparatus output terminal COut1. As previously described, the recovered information signal "d1 (t)" is also fed from the voltage comparator 334 to the multiplier 321.

The output signal of the multiplier 331 is fed to the low pass filter 333. High-frequency components (carrier components) of the output signal of the multiplier 331 are removed by the low pass filter 333 so that a signal expressed as "$(A1 \cdot A2/2) \cdot d2(t)$" appears at the output terminal of the low pass filter 333. The output signal of the low pass filter 333 is fed to the voltage comparator 335. The voltage comparator 335 serves as a waveshaper which converts the output signal of the low pass filter 333 into a recovered information signal expressed as "d2(t)". The recovered information signal "d2(t)" is applied from the voltage comparator 335 to the apparatus output terminal COut2. As previously described, the recovered information signal "d2 (t)" is also fed from the voltage comparator 335 to the multiplier 311.

Generally, a parallel-to-serial converter (not shown) follows the apparatus output terminals COut1 and COut2. The parallel-to-serial converter combines the recovered information signals "d1(t)" and "d2(t)" into an original digital information signal "d(t)".

What is claimed is:

1. A spread spectrum demodulating apparatus comprising:
   a local oscillator;
   a frequency multiplier multiplying a frequency of an output signal of the local oscillator by a predetermined integer;
   frequency converting means for multiplying a received spread spectrum modulation signal and an output signal of the frequency multiplier to execute frequency conversion and thereby to convert the received spread spectrum modulation signal into an intermediate-frequency spread spectrum modulation signal;
   despreading means for multiplying the intermediate-frequency spread spectrum modulation signal and a spread code, and thereby despreading the intermediate-frequency spread spectrum modulation signal into a despread demodulation signal in response to the spread code;
   a level discriminator discriminating a level of the despread demodulation signal;
   primary demodulating means for demodulating the despread demodulation signal into a recovered original information signal;
   a noise level detector detecting a level of noise in an output signal of the primary demodulating means;
   a selector selecting one of an output signal of the level discriminator and an output signal of the noise level detector;
   a controller generating a control signal in response to the signal selected by the selector;
   a PLL circuit contained in the primary demodulating means;
   a frequency divider dividing a frequency of an output signal of the PLL circuit by a predetermined integer N1·N2;
   a second frequency divider dividing a frequency of an output signal of the local oscillator by a predetermined integer N2;
   an operation device executing predetermined logic operation between an output signal of the first frequency divider and an output signal of the second frequency divider;

a second oscillator outputting a signal having a frequency which varies between frequency limits, serving as a clock signal;

a switch selecting one of the output signal of the second oscillator and an output signal of the operation device in response to the control signal generated by the controller; and a spread code generator using the signal selected by the switch as a code generation clock signal; and generating the spread code in response to the code generation clock signal.

2. The spread spectrum demodulating apparatus of claim 1, wherein the primary demodulating means comprises:

first and second multipliers receiving the despread demodulation signal;

the PLL circuit including the second multiplier and generating a phase-locked signal in response to an output signal of the first multiplier;

a phase shifter shifting a phase of the phase-locked signal and thereby converting the phase-locked signal into a phase-shifted signal;

a second switch selecting one of the phase-locked signal and the phase-shifted signal;

a third multiplier multiplying the despread demodulation signal and the signal selected by the second switch to execute primary demodulation;

a low pass filter processing an output signal of the third multiplier;

a power supply feeding a constant voltage; and a third switch selecting one of an output signal of the low pass filter and the constant voltage fed by the power supply, and feeding said selected one to the first multiplier.

3. The spread spectrum demodulating apparatus of claim 1, further comprising a processor processing the recovered original information signal outputted from the primary demodulating means, and a third frequency divider dividing a frequency of the output signal of the operation device and feeding an output signal thereof to the processor as a signal processing clock signal.

4. The spread spectrum demodulating apparatus of claim 1, wherein the frequency multiplier and the frequency converting means comprise a plurality of sub frequency multipliers multiplying the frequency of the output signal of the local oscillator by respective predetermined integers, a sum of which is equal to a predetermined integer N1, and a plurality of mixers connected in series and receiving output signals of the sub frequency multipliers respectively.

5. A demodulating apparatus comprising:

a PLL circuit reproducing a carrier signal from an input modulation-resultant signal;

a phase shifter shifting a phase of the reproduced carrier signal by a predetermined amount;

a first switch selecting one of the reproduced carrier signal and an output signal of the phase shifter;

a first multiplier multiplying the input modulation-resultant signal and the signal selected by the first switch, and thereby recovering an original information signal from the input modulation-resultant signal;

a second multiplier contained in the PLL circuit; and a second switch selecting one of the recovered original information signal and a dc bias voltage, and feeding the selected one to the second multiplier.

6. A demodulating apparatus comprising:

first and second multipliers receiving an input modulation-resultant signal;

a PLL circuit including the second multiplier, a loop filter, a voltage-controlled oscillator, and a third multiplier;

a phase shifter shifting a phase of an output signal of the oscillator by a predetermined amount;

a first switch selecting one of the output signal of the oscillator and an output signal of the phase shifter, and feeding the selected one to the first multiplier;

a low pass filter processing an output signal of the first multiplier, and feeding an output signal thereof to the third multiplier; and a second switch selecting one of the output signal of the oscillator and an output signal of the third multiplier, and feeding the selected one to the second multiplier.

7. The demodulating apparatus of claim 6, wherein the third multiplier multiplies the output signal of the low pass filter and an output signal of the second multiplier, and the second switch comprises a selector which selects one of the output signal of the second multiplier and the output signal of the third multiplier, and which feeds the selected one to the loop filter.

8. The demodulating apparatus of claim 7, further comprising a second low pass filter connected between the output of the second multiplier and an input to the third multiplier.

9. A spread spectrum demodulating apparatus comprising:

a spread code generator generating a spread code;

despreading demodulation means for multiplying an incoming spread spectrum modulation signal and the spread code;

a carrier reproducing circuit extracting carrier components of an output signal of the despreading modulation means, and reproducing a carrier in response to the extracted carrier components;

primary demodulating means for multiplying the reproduced carrier and the output signal of the despreading modulation means to demodulate the output signal of the despreading modulation means into a recovered original information signal, a PLL circuit contained in the carrier reproducing circuit and generating an error signal; and synchronization detecting means for discriminating a noise level of the error signal and outputting a signal for detection of synchronization in response to the discriminated noise level.

10. The spread spectrum demodulating apparatus of claim 9, wherein the carrier reproducing circuit comprises:

a frequency doubler doubling a frequency of the output signal of the despreading modulation means;

a limiter amplifier amplifying an output signal of the frequency doubler while limiting an amplitude of an output signal thereof;

the PLL circuit producing a carrier generating signal in response to an output signal of the limiter amplifier;

a phase shifter shifting a phase of the carrier generating signal by a predetermined amount; and a frequency divider dividing a frequency of an output signal of the phase shifter by a predetermined integer, and thereby reproducing the carrier in response to the output signal of the phase shifter.

11. The spread spectrum demodulating apparatus of claim 9, wherein the carrier reproducing circuit comprises:

inverse modulating means for multiplying the recovered original information signal and the output signal of the despreading modulation means to cancel information-signal components of the output signal of the despreading modulation means;

carrier extracting means for extracting a carrier component from an output signal of the inverse modulating means;

a limiter amplifier amplifying the extracted carrier component while limiting an amplitude of an output signal thereof;

the PLL circuit reproducing the carrier in response to an output signal of the limiter amplifier; and a phase shifter shifting a phase of the reproduced carrier by a predetermined amount.

12. The spread spectrum demodulating apparatus of claim 9, wherein the synchronization detecting means comprises a nonlinear detector enlarging a noise level difference between a synchronized point and a non-synchronized point, and a level discriminator discriminating a noise level in response to an output signal of the nonlinear detector.

13. The spread spectrum demodulating apparatus of claim 12, wherein the nonlinear detector outputs a signal with a constant level when the noise level of the error signal exceeds a given threshold level.

14. The spread spectrum demodulating apparatus of claim 9, wherein the synchronization detecting means comprises a noise detector detecting noise at a synchronized point and a non-synchronized point, a filter following the noise detector and removing a portion of the noise components, the portion corresponding to a signal component resulting from differentiation of an information signal, and a level discriminator discriminating a noise level in response to an output signal of the filter.

15. The spread spectrum demodulating apparatus of claim 14, wherein the filter comprises one of a comb filter or a notch filter tuned to a frequency related to a rate of an information signal.

16. A spread spectrum demodulating apparatus comprising:

despreading demodulation means for multiplying an incoming spread spectrum modulation signal and a spread code, and thereby despreading the incoming spread spectrum modulation signal into a despread demodulation signal in response to the spread code;

a low pass filter passing a multiple-phase PSK signal in the despread demodulation signal;

a carrier reproducing circuit reproducing a carrier in response to the multiple-phase PSK signal;

primary demodulating means for multiplying the reproduced carrier and the multiple-phase PSK signal, and thereby demodulating the multiple-phase PSK signal into a plurality of demodulation-resultant signals;

a PLL circuit contained in the carrier reproducing circuit and generating an error signal;

a level discriminator discriminating a noise level of the error signal, and generating a synchronization capturing signal in response to the discriminated noise level; and synchronization capturing means for capturing synchronization in response to the synchronization capturing signal.

17. The spread spectrum demodulating apparatus of claim 16, wherein the carrier reproducing circuit comprises detecting means for canceling information-signal components of the multiple-phase PSK signal to detect a carrier component thereof, a limiter amplifier amplifying the detected carrier component while limiting an amplitude of an output signal thereof, and the PLL circuit reproducing a multiple-phase carrier and generating the error signal in response to an output signal of the limiter amplifier.

* * * * *

UNITED STATES PATENT AND TRADEMARK OFFICE
CERTIFICATE OF CORRECTION

PATENT NO. :   5,832,027
DATED      :   November 3, 1998
INVENTOR(S):   Yukinobu Ishigaki It is certified that error appears in the above-identified patent and that said Letters Patent is hereby corrected as shown below:

Title page. item [30] Foreign Application Priority Data, after "Nov. 29. 1993  [JP]  Japan . . . 5-32362" insert a new line as follows:

--Dec. 28, 1993  [JP]  Japan . . . 5-353933--.

Signed and Sealed this

Twenty-seventh Day of April, 1999

Attest:

Q. TODD DICKINSON

Attesting Officer

Acting Commissioner of Patents and Trademarks